US012099453B2

(12) United States Patent
Dally et al.

(10) Patent No.: US 12,099,453 B2
(45) Date of Patent: Sep. 24, 2024

(54) APPLICATION PARTITIONING FOR LOCALITY IN A STACKED MEMORY SYSTEM

(71) Applicant: NVIDIA Corporation, Santa Clara, CA (US)

(72) Inventors: William James Dally, Incline Village, NV (US); Carl Thomas Gray, Apex, NC (US); Stephen W. Keckler, Austin, TX (US); James Michael O'Connor, Austin, TX (US)

(73) Assignee: NVIDIA Corporation, Santa Clara, CA (US)

( * ) Notice: Subject to any disclaimer, the term of this patent is extended or adjusted under 35 U.S.C. 154(b) by 183 days.

(21) Appl. No.: 17/709,031

(22) Filed: Mar. 30, 2022

(65) Prior Publication Data

US 2023/0315651 A1 Oct. 5, 2023

(51) Int. Cl.
*G06F 13/16* (2006.01)
*G11C 8/12* (2006.01)
*H03K 19/1776* (2020.01)

(52) U.S. Cl.
CPC ........ *G06F 13/161* (2013.01); *G06F 13/1673* (2013.01); *G06F 13/1689* (2013.01); *G11C 8/12* (2013.01); *H03K 19/1776* (2013.01)

(58) Field of Classification Search
CPC ............ G06F 13/1657; G06F 13/1673; G06F 13/1689; G06F 7/52–5277; G06F 7/53–5375; G11C 8/12; H03K 19/17748; H03K 19/1776; G06N 5/00–048; G06N 20/00; G06N 20/10; G06N 20/20

USPC ................ 257/202–213; 326/37–45; 706/15; 708/501, 607; 711/5

See application file for complete search history.

(56) References Cited

U.S. PATENT DOCUMENTS

| | | | | |
|---|---|---|---|---|
| 10,461,076 | B1 * | 10/2019 | Brewer | H01L 21/76898 |
| 2017/0139635 | A1 * | 5/2017 | Jayasena | G11C 5/025 |
| 2018/0329820 | A1 * | 11/2018 | Sinha | G06F 15/17 |
| 2022/0269436 | A1 * | 8/2022 | Kellam | G06F 12/0284 |
| 2023/0058355 | A1 * | 2/2023 | Hornung | G06F 9/30087 |
| 2023/0305888 | A1 * | 9/2023 | Zaykov | G06F 9/5038 718/102 |

* cited by examiner

*Primary Examiner* — Ilwoo Park
(74) *Attorney, Agent, or Firm* — Leydig, Voit & Mayer, Ltd.

(57) ABSTRACT

Embodiments of the present disclosure relate to application partitioning for locality in a stacked memory system. In an embodiment, one or more memory dies are stacked on the processor die. The processor die includes multiple processing tiles and each memory die includes multiple memory tiles. Vertically aligned memory tiles are directly coupled to and comprise the local memory block for a corresponding processing tile. An application program that operates on dense multi-dimensional arrays (matrices) may partition the dense arrays into sub-arrays associated with program tiles. Each program tile is executed by a processing tile using the processing tile's local memory block to process the associated sub-array. Data associated with each sub-array is stored in a local memory block and the processing tile corresponding to the local memory block executes the program tile to process the sub-array data.

25 Claims, 18 Drawing Sheets

APPLICATION PARTITIONING FOR LOCALITY IN A STACKED MEMORY SYSTEM

BACKGROUND

Current high-performance computing (HPC) and graphics processing are capable of utilizing more memory bandwidth than can currently be provided given modern system memory implementations. For example, many HPC applications have a byte to floating-point operation (B:F) ratio between 8:1 and 1:1. Therefore, the HPC applications require from one to eight bytes from main memory for every floating-point operation performed. In another example, the High-Performance Conjugate Gradients (HPCG) Benchmark, has a B:F ratio greater than four. Modern graphics processing units (GPUs) having a B:F ratio of 1:10 create a significant memory limitation for such applications. A solution is needed for an improved high-performance memory implementation within a processing environment, as well as a means to implement memory accesses in a localized manner within such an environment in order to reduce the energy and latency of memory accesses.

SUMMARY

Embodiments of the present disclosure relate to application partitioning for locality in a stacked memory system. In an embodiment, one or more memory dies are stacked on the processor die. The processor die includes multiple processing tiles and each memory die includes multiple memory tiles. Vertically aligned memory tiles are directly coupled to and comprise the local memory block for a corresponding processing tile. An application program that operates on dense multi-dimensional arrays (matrices) may partition the dense arrays into sub-arrays associated with program tiles. Each program tile is executed by a processing tile using the processing tile's local memory block to process the associated sub-array. Data associated with each sub-array is stored in a local memory block and the processing tile corresponding to the local memory block executes the program tile to process the sub-array data. The ratio of memory bandwidth (byte) to floating-point operation (B:F) may improve 50× for accessing the local memory block compared with conventional memory. Additionally, the energy consumed to transfer each bit may be reduced by 10×.

In an embodiment, executing an application program by a stacked memory system comprises partitioning an N-dimensional array for an operation executed by the application program into a first number of the N-dimensional sub-arrays and instantiating portions of the application program that include the operation to produce a second number of program tiles. A portion of data associated with each sub-array is stored in a local memory block comprising a memory tile of memory tiles, where the memory tiles are fabricated within a memory die that is stacked with a processor die within which processing tiles are fabricated and conductive paths couple each processing tile to a corresponding one of the memory tiles for communication between each processing tile and the corresponding memory tile. The second number of the program tiles is executed by the processing tiles to compute results for the operation. In an embodiment, the processor is a streaming multiprocessor within a graphics processing unit (GPU). In an embodiment, the processor die is "upside down" relative to the memory die. In an embodiment, an interposer may be included within a device that includes the processor die and the memory die.

In an embodiment, executing an application program by a computer system which includes a stacked memory system, the stacked memory system having a processor die stacked with one or more memory dice, the application program including an operation which uses an N-dimensional array of memory, comprises partitioning the N-dimensional array into a first number of N-dimensional sub-arrays. Portions of the application program that include the operation are instantiated to produce a second number of program tiles and data for processing each sub-array to are distributed to memory tiles, where the memory tiles are fabricated within each of the one or more memory dice and conductive paths couple each memory tile to a corresponding processing tile of processing tiles that are fabricated within the processor die. The second number of the program tiles is executed by the processing tiles to compute results for the operation.

BRIEF DESCRIPTION OF THE DRAWINGS

The present systems and methods for application partitioning for locality in a stacked memory system are described in detail below with reference to the attached drawing figures, wherein.

DETAILED DESCRIPTION

Systems and methods are disclosed related to memory stacked on processor for high bandwidth. A one-level memory may be provided for a processing system by stacking bulk memory on the processor die. Such an arrangement may provide a significantly improved B:F ratio when compared to contemporary GPUs, increasing the B:F ratio from 0.08 by 50× to 4. Such an increase translates to a comparable increase in performance on bandwidth limited HPC applications. The stacked die arrangement may also lower memory transfer energy per bit by 10×, reducing the memory access energy from 5 pJ/bit to 500 fJ/bit.

Figure 1A:
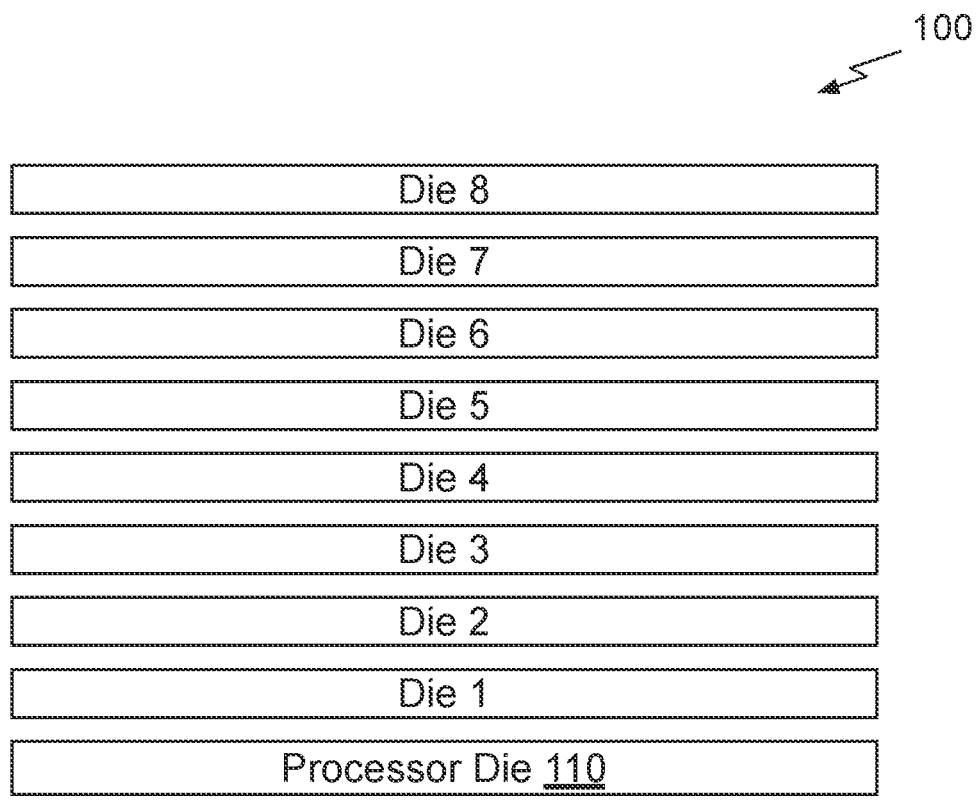
FIG. 1A is a conceptual diagram of a die stack, in accordance with an embodiment.

FIG. 1A is a conceptual diagram of a die stack 100, in accordance with an embodiment. Die 1-8 are memory stacked on a processor die 110. In an embodiment, at least one memory die is stacked on the processor die 110. In an embodiment, the processor die 110 and the memory die are stacked with the top sides of each die facing the same direction. In an embodiment, the processor die 110 is "upside down" relative to the memory die so that the top side of the processor die 110 faces the opposite direction compared with the top side of each memory die. The processor die 110 and memory die are aligned in a first dimension (e.g., a dimension defining a horizontal axis or plane) and are stacked in a second dimensional (e.g., a dimension defining a vertical axis or plane).

In an embodiment, an interposer may be included within a device that includes the processor die 110 and the memory die. The processor die 110 may be fabricated to include multiple processing units that are each independently coupled to a dedicated portion of the bulk memory provided by the die 1-8. The dedicated portion of the bulk memory coupled directly to a particular processing unit is a local memory block. Local memory accesses by the processing units are accomplished through interconnection structures between each processing unit and the memory die. The processor die 110 may be coupled to the bottom of die 1 and the interconnection structures route signals from each of the memory die 1-8 through the memory die underneath and continuing to the processor die 110. In an embodiment, the interconnection structures comprise through-silicon via (TSV) and/or through-die via (TDV) structures that provide a conductive path (electrical connection) fabricated between a contact (connection pad) on a front surface of the die to a contact on a back (opposing) surface of the die.

The interconnection structures can include routing structures, which can include any combination of microbumps, connection pads, hybrid bonds, or metal line routings located on the front surface or back surface of the die. In an embodiment, the interconnection structure forms a stair-step conductive path. The stair-step conductive paths of one of the memory dies can be interconnected to another one of the stair-step conductive paths of another one of the memory dies to form one of a plurality of conductive staircase structures through two or more of the memory dies. The stair-step conductive paths can be connected to reduce signal cross talk between the conductive staircase structures whereby at least some of the conductive stair-case structures are connected to transmit a same polarity of electrical signals are spatially separated in a dimension that is perpendicular to a surface of the memory dies.

The staircase connection structures form arrays of interconnections that help reduce insertion loss and crosstalk by providing shielding in three spatial dimensions, and in particular, by enhancing the vertical shielding between TDV staircases formed through different memory dies in the stack. Some such TDV staircase arrangements reduce insertion loss and crosstalk by: centering input-output connections within the TDV staircase connection arrays, by shifting and offsetting, serpentining, meandering or twisting pairs of TDV staircase structure in the array and/or by providing cross-talk cancellation and shielding.

The term, conductive, as used herein refers to electrical conduction as part of the transmission of an electrical signal connected as electrical signals (e.g., digital or analog signals) in a device (e.g., an integrated circuit device), such as high bandwidth dynamic random access memory (DRAM) devices, as familiar to those skilled in the pertinent art. The terms, interconnected or connected, as used herein, refer to electrical connection features between the component structures of the interconnection structures for the transmission of the electrical signals. In some such embodiments, the electrical signals are data-carrying signals or return path signals. The term return path signal, as used herein, refers to any voltage as part of the return path, e.g., a ground connection, or a supply connection (e.g., a voltage applied to drain, VDD), which is generally represented as "GND".

More illustrative information will now be set forth regarding various optional architectures and features with which the foregoing framework may be implemented, per the desires of the user. It should be strongly noted that the following information is set forth for illustrative purposes and should not be construed as limiting in any manner. Any of the following features may be optionally incorporated with or without the exclusion of other features described.

Figure 1B:
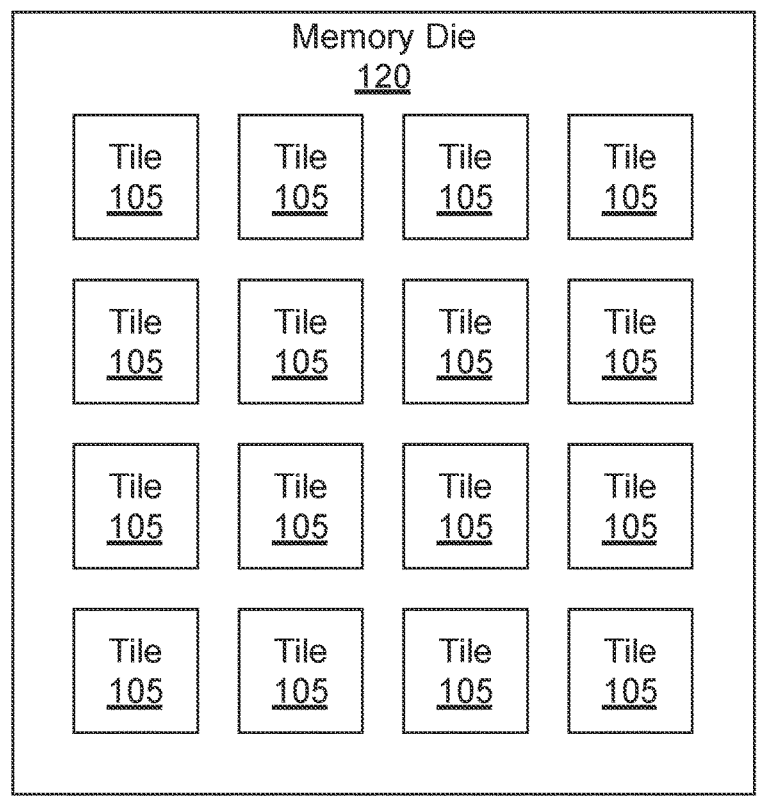
FIG. 1B is a conceptual diagram of a memory die with memory tiles, in accordance with an embodiment.

FIG. 1B is a conceptual diagram of a memory die 120 with memory tiles 105, in accordance with an embodiment. An array of the memory tiles 105 is fabricated within the memory die 120. In an embodiment, the number of memory tiles 105 may be greater or less than the 16 memory tiles 105 shown in FIG. 1B. In an embodiment, the input/output (I/O) circuitry for each memory tile 105 is located (fabricated) near the center of the memory tile 105 and the memory cells are fabricated on either side of the I/O circuitry. Therefore, the memory die 120 has I/O circuitry distributed across the die. In contrast, a conventional memory die has I/O circuitry at the perimeter of the die.

In an embodiment, the memory die 120 comprises DRAM and each memory tile 105 corresponds to a channel. In an embodiment, a channel is 256 Mbits (32 MBytes) and may include spare rows and/or columns. Each memory tile 105 may function independently, so that data and/or request signals are not transmitted between the memory tiles 105 within the same memory die 120.

In an embodiment, the memory tile 105 comprises eight banks of memory, four on each side of a column decoder and a data sense amp block. In an embodiment, contacts of the interconnection structures are positioned within the data sense amp block. Locating the interconnection structure contacts between the banks of memory minimizes routing lengths of the data and request signals. The energy cost of routing may be 80 fJ/bit for each mm of routing, so reducing routing lengths also reduces energy. In contrast, some conventional memory die layouts route the data and request signals to pads located at the perimeter of the memory die. Other conventional memory die layouts route the data and request signals to pads located at the center of the memory die which also requires additional routing from the center of the memory die to each memory tile. Because the pads are located at the perimeter, the memory bandwidth of the conventional memory die is proportional to the perimeter length. Consequently, greater memory bandwidth is provided by larger memory die. For example, high-bandwidth memory may provide 200 Gbit/second for each mm of die perimeter. Providing the interconnection structure that is primarily in a direction perpendicular to the memory die 120 surface and that is coupled directly to each memory tile 115 without requiring routing of the data and request signals to the perimeter of the memory die 120 reduces energy and provides high bandwidth between each memory tile 115 and the associated processing tile in the die stack 100. The B:F ratio may improve 50× for accessing the local memory block compared with conventional memory. Additionally, the energy consumed to transfer each bit between memory and the processor may be reduced by 10×.

Figure 1C:
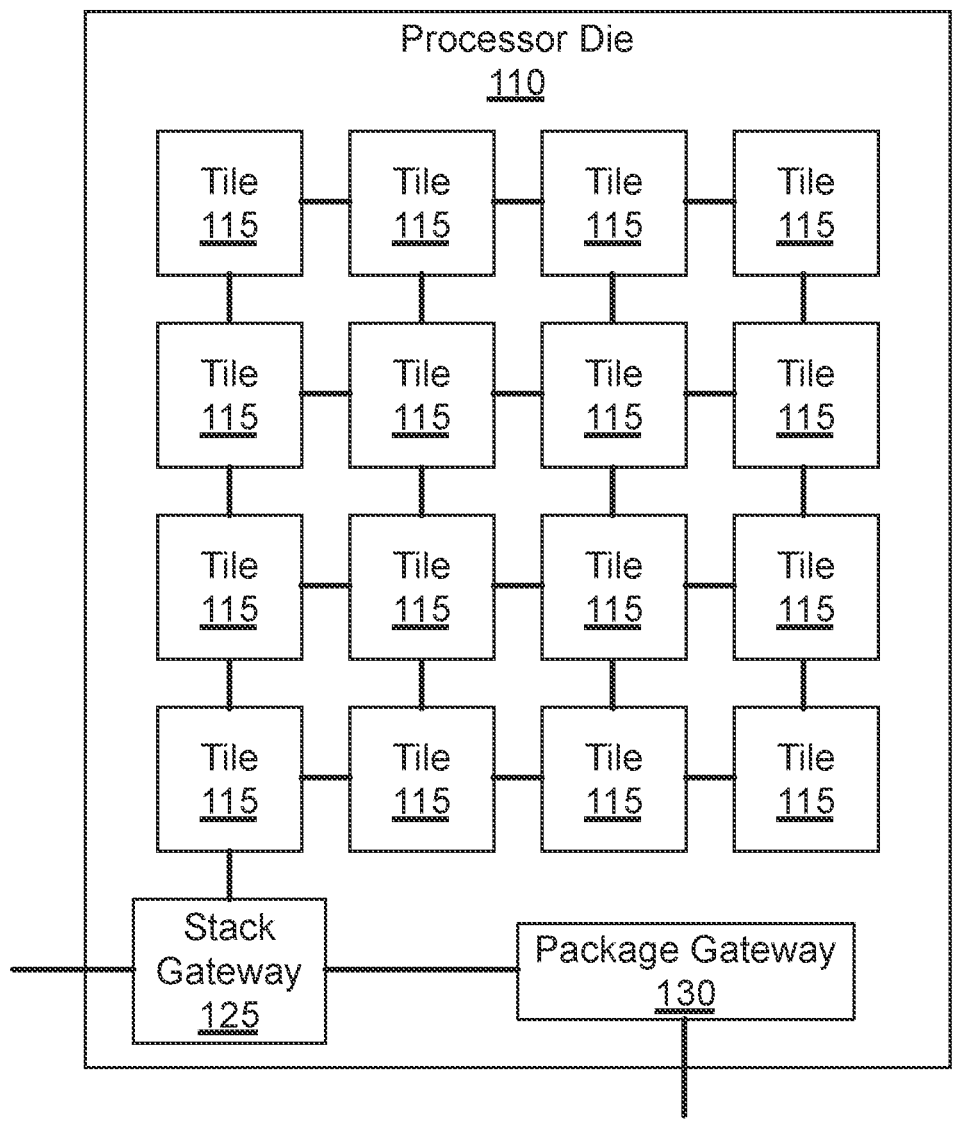
FIG. 1C is a conceptual diagram of a processor die with processing tiles, in accordance with an embodiment.

FIG. 1C is a conceptual diagram of processor die 110 with processing tiles 115, in accordance with an embodiment. An array of the processing tiles 115 is fabricated within the processor die 110. In an embodiment, the number of processing tiles 115 may be more or less than the 16 processing tiles 115 shown in FIG. 1C. In an embodiment, N processing tiles 110 are coupled to M memory tiles 105. In an embodiment, within the die stack 100, vertically aligned memory tiles 105 within each one of the memory die 120 comprise the local memory block for the processing tile 115. In an embodiment, to minimize routing path lengths, each processing tile 115 is coupled to the memory tile(s) 105 that are vertically stacked directly above the processing tile 115. In an embodiment, the I/O circuitry for each processing tile 115 is also located near the center of the processing tile 105 to minimize horizontal routing path lengths.

In an embodiment, when eight memory die 120 are stacked on the processor die 110, each processing tile may be aligned with and coupled to eight memory tiles 105, one memory tile 105 within each memory die 120, providing eight channels of local memory as a local memory block for the processing tile 115. In an embodiment, each memory tile 120 may transfer 32 Bytes of data to or from the corresponding processing tile 115 in a cycle. Thus, the memory bandwidth increases as the number of memory die 120 in the die stack 100 increases. In an embodiment, the number of memory tiles 105 in a memory die 120 is greater or less than the number of processing tiles and each processing tile 115 is directly coupled to more than one memory tile 120 in each memory die 120.

In an embodiment, redundancy for each memory tile 105 is managed by the processing tile 115 that is directly coupled to the memory tile 105. The processing tile 115 may maintain a table of bad rows within the local memory block for translating an address in a bad row to a spare row address before an access request is transmitted to the local memory block. Likewise, the processing tile 115 may maintain a table of bad columns within the local memory block for multiplexing a spare column to replace a bad bit for accesses. In addition, the processing tile 115 may deactivate (disable) an entire memory channel of the local memory block.

In an embodiment, each processing tile 115 and aligned memory tile(s) 105 have a 1 mm² footprint of die area. Assuming a die stack includes eight memory die 120, 400 GBytes/sec of memory bandwidth may be provided at 8 Gbits/sec through 400 data signals. In an embodiment, with a 5 μm hybrid-bonding pitch and 800 signal connections (allowing for power, ground, control, and address) the interconnection structure occupies 145 μm on a side or 0.021 mm², consuming only 2% of the area within each processing tile 115 or memory tile 105. In an embodiment, each processor die 110 and each of eight memory die 120 includes a 16×16 array of tiles, the processor die 110 is capable of 25 TFLOPS of double-precision processing performance and the eight memory die 120 provide 102 TBytes/sec of memory bandwidth and 128 MBytes of memory for each processing tile 115. A system may combine multiple die stacks 100 on an interposer to further increase performance. For example, combining nine die stacks 100 on an interposer that is 52 mm on a side can provide 225 TFLOPS of double-precision processing performance, 576 GBytes of DRAM capacity, and 921 TBytes/sec of memory bandwidth. Furthermore, each interposer and multiple die stack system may be packaged and combined to produce even larger systems with greater processing capacity and memory bandwidth.

As shown in FIG. 1C, the processing tiles 115 are connected to each other by a tile network. The tile network allows a first processing tile 115 to access a memory tile 105 associated with a second processing tile 115 in the same processor die 110. In an embodiment, the tile network provides a hierarchical stacked memory system within the die stack 100. In an embodiment, I/O circuitry for the tile network is fabricated at the perimeter of each processing tile 115. In an embodiment, a bandwidth capacity of the tile network is determined by a number of I/O connections provided at the perimeter of each processing tile 115 and/or bandwidth of each I/O circuit. In an embodiment, the bandwidth capacity of the tile network is less than or equal to the memory bandwidth provided by the interconnection structure. In an embodiment, the tile network comprises one of a two-dimensional (2D) mesh structure, a flattened butterfly structure, or a concentrated mesh structure.

The processing tiles 115 are also connected to a stack gateway 125 for communication with other processor die 110 on the same interposer. In an embodiment, at least one stack gateway 125 is included on each edge of the processor die 110. In an embodiment, I/O circuitry for the stack gateway 125 is fabricated at the perimeter of each processor die 110. In an embodiment, a bandwidth capacity of the stack gateway 125 is determined by a number of I/O connections provided at the perimeter of each processor die 110 and/or bandwidth of each I/O circuit. In an embodiment, the bandwidth capacity of the stack gateway 125 is less than the bandwidth capacity of the tile network. Finally, a package gateway 130 enables communication between processor die 110 on different interposers. In an embodiment, I/O circuitry for the package gateway 130 is fabricated at edges of the processor die 110 affixed at the perimeter of the interposer. In an embodiment, a bandwidth capacity of the package gateway 130 is determined by a number of I/O connections provided at the perimeter of the interposer and/or bandwidth of each I/O circuit. In an embodiment, the bandwidth capacity of the package gateway 130 is less than the bandwidth capacity of the stack gateway 125.

A mapping module (mapper) may be included within each processing tile 115 to facilitate memory localization, reducing energy and latency of memory accesses within the hierarchical stacked memory system. More specifically, the mapper may translate a memory request received from a processing unit of a processing tile 115 for implementation at a data storage entity (memory tile 105), where the translating identifies a data storage entity and a starting location within the data storage entity where the data associated with the memory request is located. The data storage entity may be in a local memory block that is co-located with the processing unit that sent the request and directly accessed through the interconnection structures, which may enable the localization of data and significantly improve the performance of memory usage by reducing an energy of data access and increasing data bandwidth.

The mapper may be configured to translate addresses for accessing not only the local memory block, but also the memory tiles stacked on other processing tiles in the same die stack that are accessed through an inter-tile network. The mapper also translates the addresses provided by a processing tile 115 to the memory tiles 105 in other die stacks 100 that are accessed through a stack gateway. Multiple die stacks 100 may be coupled to an interposer to form a device. Two or more devices may be included in a system. Therefore, the mapper translates the addresses provided by the processing tile 115 to the memory tiles 105 in die stacks 100 on different interposers that are accessed through a stack gateway 125 or package gateway.

Figure 2A:
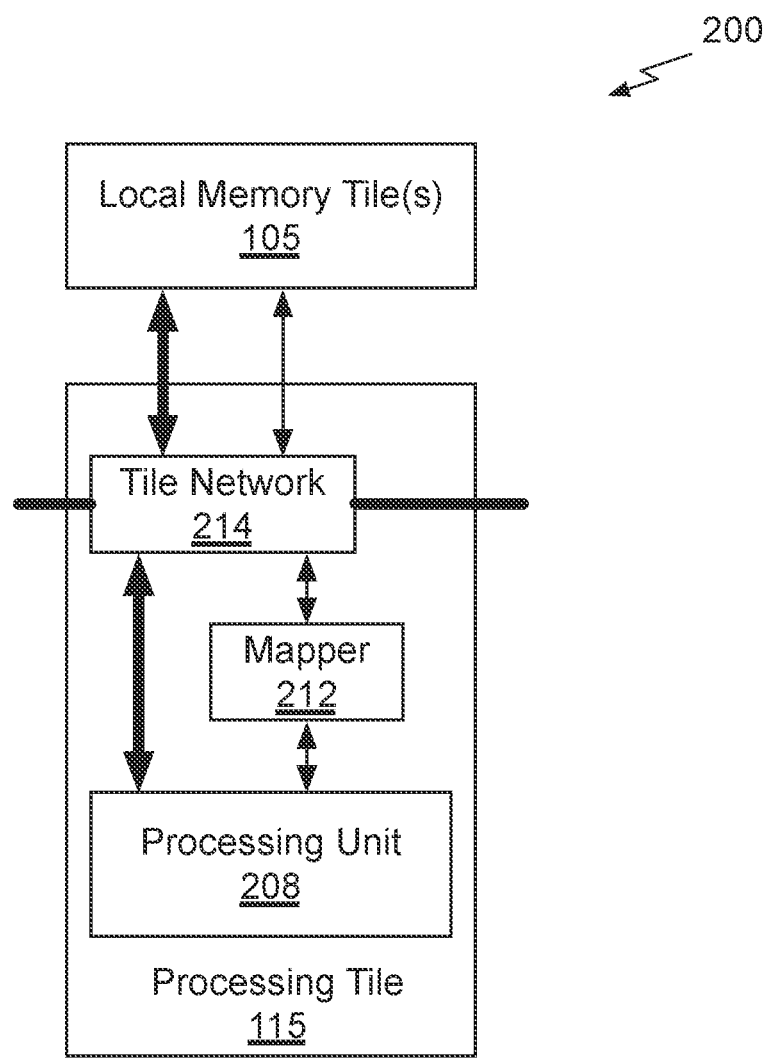
FIG. 2A illustrates an exemplary tile stack, in accordance with an embodiment.

FIG. 2A illustrates an exemplary tile stack 200, in accordance with an embodiment. The processing tile 115 includes a processing unit 208, mapper 212, and tile network 214. The tile stack 200 also includes one or more local memory tile(s) 105 (data storage entity) that are directly coupled to the processing tile by the interconnection structure and comprise the local memory block associated with the processing tile. In an embodiment, each local memory tile 105 has a 32 Byte/cycle channel with the tile network 214. It should be understood that this and other arrangements described herein are set forth only as examples. Other arrangements and elements (e.g., machines, interfaces, functions, orders, groupings of functions, etc.) may be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by entities may be carried out by hardware, firmware, and/or software. For instance, various functions may be carried out by a processor executing instructions stored in memory. Furthermore, persons of ordinary skill in the art will understand that any system that performs the operations of the tile stack 200 is within the scope and spirit of embodiments of the present disclosure.

In one embodiment, the processing unit 208 may include one or more streaming multiprocessors (SM). For example, the processing unit 208 may include a graphics processing unit (GPU) streaming multiprocessor. In another embodiment, the processing unit 208 may include a central processing unit (CPU). In an embodiment, the local memory tile(s) 105 may include any hardware utilized to store digital data. The local memory tile(s) 105 may include any hardware for storing data, such as flash memory, a storage disk, a solid-state drive, etc. In another embodiment, the local memory tile(s) 105 may include a frame-buffer bank in a GPU, a memory channel in a CPU, etc.

In an embodiment, the processing unit 208 transmits memory access requests to the mapper 212 and transmits data associated with the memory access requests to the tile network 214. The mapper 212 may return memory access request completion information to the processing unit 208. Data returned in response to the memory access requests may be returned to the processing unit 208 by the tile network 214. The mapper 212 may provide the tile network 214 with a translated address that replaces an address received from the processing unit 208 with a memory access request.

In an embodiment, memory access requests are 128 Byte cache line reads, writes, or "verbs". In an embodiment, a narrow sub-network transmits read requests and write replies and a wide sub-network transmits write requests and read replies. In an embodiment, the narrow sub-network comprises an 8 Byte-flit (flow control digit) network that handles read requests and write replies. A verb allows a processing thread to be invoked with delivery of 128 Bytes of data (and possibly return of 128 Bytes of data)—to allow implementation of arbitrary atomic memory operations. In an embodiment, the wide sub-network transmits data for invoking execution of a processing thread using the data (e.g., for a remote atomic operation). In an embodiment, the wide sub-network comprises a 160 Byte-flit network to handle write requests (with 8 Byte address and 16B byte-level bit mask), read replies, and verbs. In an embodiment, the tile network 214 can also perform fast barrier operations with an optional membership mask.

The narrow sub-network may be implemented between the mapper 212 and the processing unit 208 for transmitting read requests and write replies. The narrow sub-network may also be implemented between the mapper 212 and the tile network 214 and between the tile network 214 and the local memory tile(s) 105 for transmitting read requests and write replies. The wide sub-network may be implemented between the processing unit 208 and the tile network 214 for transmitting write requests and read replies (e.g., read data). The wide sub-network may also be implemented between the tile network 214 and the local memory tile(s) 105 for transmitting write requests and read replies (e.g., read data). The tile network 214 may implement both the narrow and wide sub-networks between the tile networks 214 of other processing tiles 115 within the processor die 110.

In an embodiment, the mapper 212 may include computing hardware that facilitates the retrieval of data from the local memory tile(s) 105. For example, the mapper 212 may receive a read or write request from the processing unit 208. In another example, the mapper 212 may receive a memory access (e.g., read or write) request from another processing tile 115 via a tile network 214. In another embodiment, the tile network 214 may forward a request directly to the local memory tile(s) 105 without passing the request through the mapper 212. In yet another embodiment, the mapper 212 may include a circuit in communication with the processing unit 208 and the local memory tile(s) 105. This communication may be direct or indirect. In another embodiment, the mapper 212 may include a specialized circuit. For example, the mapper 212 may include a specialized circuit on the same die as the processing tile 115. In yet another embodiment, the mapper 212 may include a general processor.

Also, in one embodiment, the mapper 212 may identify a virtual address included within the read or write request. In another embodiment, the mapper 212 may identify a portion of the virtual address as the segment number, and may locate a segment descriptor in a lookup table, utilizing the segment number. In yet another embodiment, using the segment descriptor and an address (extracted from the virtual address), the mapper 212 may identify local memory tile(s) 105 (or other local memory tile(s) 105 within another tile stack 200) and a starting location within the local memory tile(s) 105 (e.g., a location where the data read or write is to be performed). In another example, the mapper 212 may identify the tile stack 100 containing the local memory tile(s) 105, as well as the starting location within the local memory tile(s) 105. In still another embodiment, the mapper 212 may implement the read or write request utilizing the identified data storage entity (local memory tile(s) 105 or local memory block) and starting location within the data storage entity.

In addition, in one embodiment, the mapper 212 may include computing hardware that facilitates the storage of data to the local memory tile(s) 105. For example, given an N-dimensional array to be stored within the local memory tile(s) 105, the mapper 212 may map the N-dimensional array such that one N-dimensional sub-array of the N-dimensional array is stored within the local memory tile(s) 105. In another example, the N-dimensional sub-arrays of the N-dimensional array may be stored within a predetermined segment (portion) of the local memory tile(s) 105.

Further, in one embodiment, the mapper 212 may perform a predetermined function (e.g., a shuffle operation) on bits of an address field for stored data (e.g., an N-dimensional array) to form a data storage entity address for the data (e.g., that indicates the local memory tile(s) 105 storing the data or the tile stack 200 containing the local memory tile(s) 105) and an offset location within the local memory tile(s) 105 for the data.

Further still, in one embodiment, the mapper 212 may store a segment descriptor (e.g., in a lookup table) that is associated with a predetermined segment (portion) of the virtual address space where the N-dimensional array is stored. In another embodiment, the segment descriptor may indicate how to use the bits of a virtual address to identify the local memory tile(s) 105 where the data is stored or the tile stack 200 containing the local memory tile(s) 105 where the data is stored, as well as the offset location within the local memory tile(s) 105 where the data is located. In yet another embodiment, the mapper 212 may store a plurality of segment descriptors, where each segment descriptor is associated with an N-dimensional matrix stored within a data storage entity in communication with the mapper 212.

Also, in one embodiment, given an N-dimensional array to be stored within the system, the mapper 212 may map the N-dimensional array such that N-dimensional sub-arrays of the N-dimensional array are stored across a plurality of different data storage entities. For example, the N-dimensional sub-arrays of the N-dimensional array may be interleaved by dimension at a predetermined granularity across the plurality of different data storage entities. In another embodiment, the N-dimensional sub-arrays of the N-dimensional array may be mapped to a predetermined subset of the plurality of data storage entities.

Figure 2B:
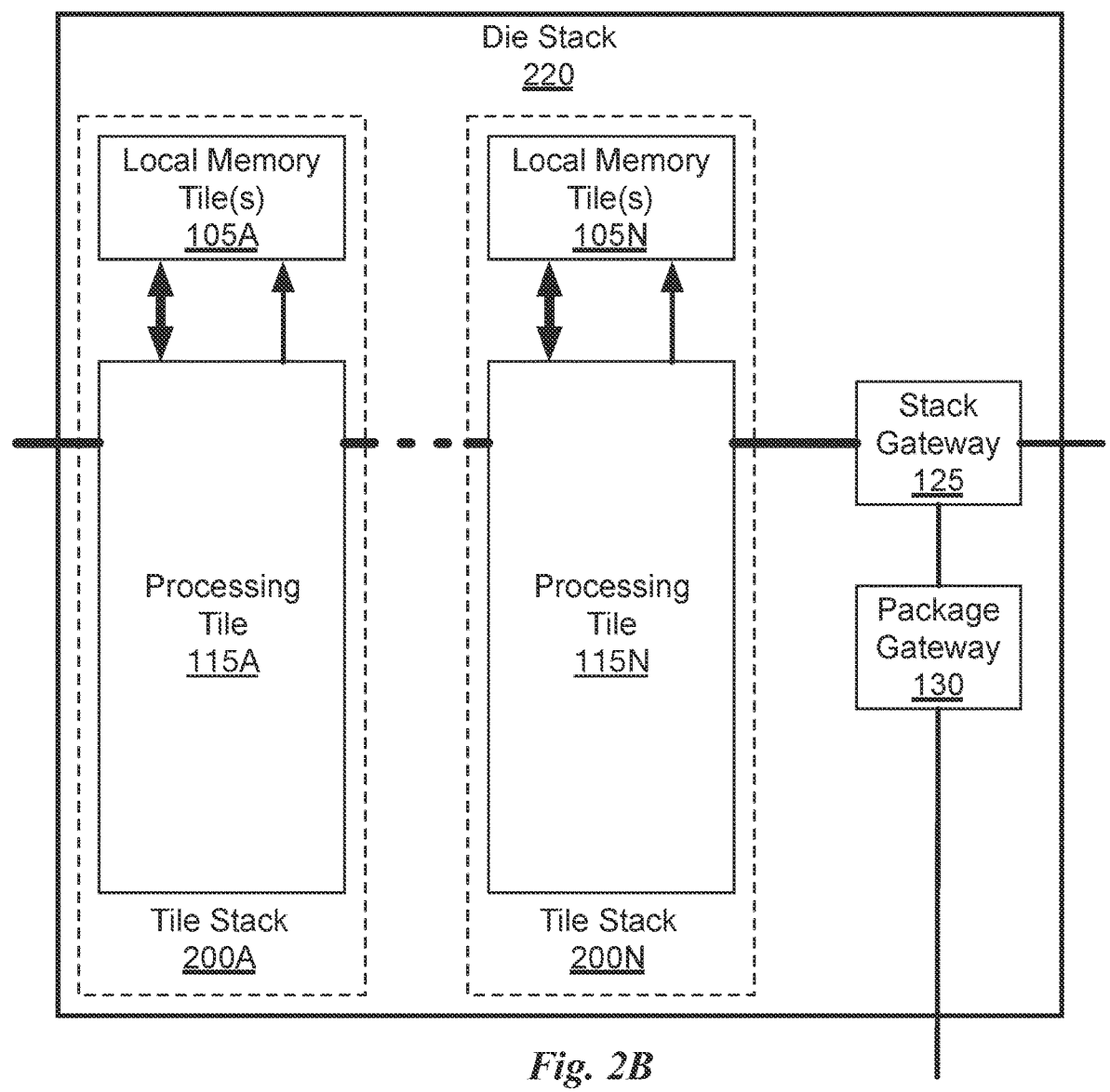
FIG. 2B illustrates an exemplary one-level memory system, in accordance with an embodiment.

FIG. 2B illustrates an exemplary hierarchical, stacked memory system, in accordance with an embodiment. The one-level memory system comprises a die stack 220 (or the die stack 100) and multiple tile stacks 200A-N. Within each tile stack 200A-N, a processing tile 115A-N is co-located with a local memory block comprising local memory tile(s) 105A-N. A portion of the local memory tile(s) 105A-N may be mapped into the address space so that the state of one partition of a problem (e.g., a sub-volume of a 3D physics simulation, or a sub-matrix of a matrix calculation) resides entirely within the local memory tile(s) 105A-N. Other portions of the local memory tile(s) 105A-N can be mapped as a cache, or as interleaved memory to hold global state shared by all partitions or to hold a sub-matrix of a different matrix.

Further, memory requests by a processing tile 115A-N are translated by a corresponding mapper 212A-N that maintains mappings for each memory segment. Segments may be mapped entirely to one local memory tile 105A-N, or interleaved by dimension at a specified granularity across multiple local memory tile(s) 105A-N. Local requests, within a tile stack 200A-N, are forwarded directly to the corresponding local memory tile(s) 105A-N (e.g., through the tile network 214A-N). In an embodiment, each tile network 214 routes a request received from a different processing tile 115 to either the local memory tile(s) 105 directly coupled to the tile network 214 or forwards the request to a neighboring processing tile 115. Thus, latency for processing the request may increase linearly with each "hop" when the request is forwarded to another processing tile 115. Remote requests between different tile stacks 200A-N the same die stack 220 are directed to the destination local memory tile(s) 105A-N via the tile networks 214A-N within the different tile stacks 200A-N.

Figure 2C:
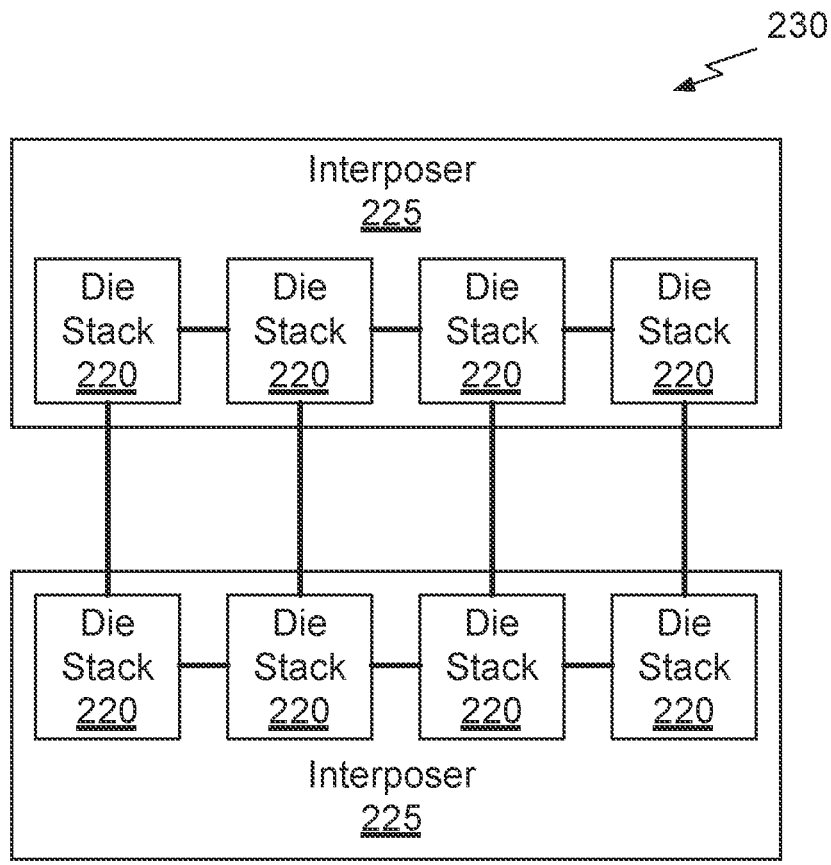
FIG. 2C illustrates an exemplary system including a hierarchical network and die stacks, in accordance with an embodiment.

FIG. 2C illustrates an exemplary system 230 including a hierarchical network and die stacks, in accordance with an embodiment. As shown, the system 200 includes two interposers 225, where each of the interposers 225 includes a plurality of die stacks 220, and each of the plurality of die stacks 220 includes a plurality of tile stacks 200A-N. In other embodiments, additional interposers 225 may be included in the system 200.

In an embodiment, the tile network 214 provides flat (uniform) bandwidth within each die stack 220 and also provides reduced memory access latency for nearby tile stacks 200 within each die stack 220. In an embodiment, the inter-die network provided by the tile networks 214 and the stack gateway 125 can saturate edge bandwidth available for the processor die 110 and die stack 220 for accessing other die stacks 220 on the same interposer 225. Similarly, the tile networks 214, the stack gateway 125, and the package gateway 130 can saturate edge bandwidth available for the die stacks 220 on the same interposer 225 to access die stacks 220 on a different interposer 225.

The system 230 has a much higher ratio of FLOPS to memory capacity compared with conventional systems. Assuming that 1 TByte is needed to store state data for a computation, a conventional system with 80 GBytes would require 13×20 TFLOPS of processing provided by GPUs (260 TFLOPS total) to provide the required memory capacity. In contrast, a system similar to the system 230 with 1 TByte of memory implemented using four interposers of nine die stacks each provides 899 TFLOPS of double-precision performance and 3.6 PBytes/sec of memory bandwidth.

Figure 2D:
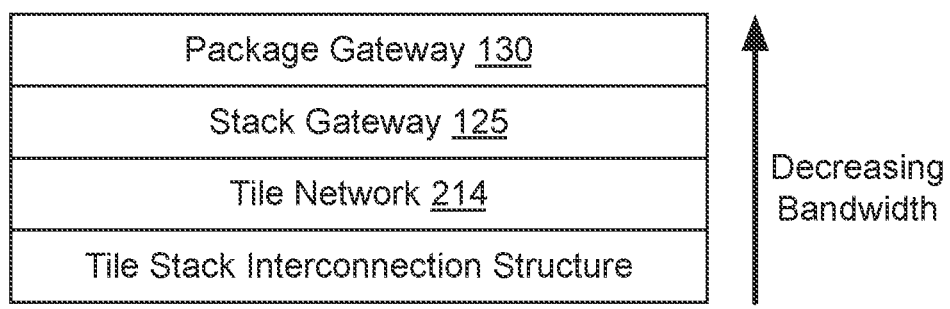
FIG. 2D illustrates the network hierarchy and corresponding communication mechanism, in accordance with an embodiment.

FIG. 2D illustrates the network hierarchy and corresponding communication mechanism, in accordance with an embodiment. In an embodiment, a first level of the hierarchical network comprises a tile stack interconnection structure. Specifically, conductive paths between each processing tile 115 fabricated in the processor die 110 and a corresponding memory tile 105 fabricated in each memory die 120 of at least one memory die 120 enable communication between each processing tile 115 and the corresponding memory tile 105, where the processor die 110 and the at least one memory die 120 comprise a die stack 100 or 220 and the corresponding memory tile 105 is stacked on the processing tile 115. In an embodiment, one or more levels of the hierarchical network comprise two sub-networks, a narrow network to handle read requests and write replies and a wide network to handle write requests and read replies. The first level of the hierarchical network provides the highest bandwidth and lowest latency through the tile stack interconnection structure between each processing tile 115 and the local memory tile(s) 105. In an embodiment, the bandwidth between each processing tile 115 and the local memory tile(s) 105 is 400 GBytes/sec.

Including multiple processing units 208 within a processing tile 110 that share a single memory bank may simplify programming and design of the memory tile 105. For example, a processing tile 110 of four processing units, such as the SMs 440 of FIG. 4C, may share a 512 Mbyte memory bank with 1.6 TByte/sec of bandwidth, or a processing tile 110 of 16 SMs 440 may share 2 GByte memory bandwidth 6.4 TBytes/sec of bandwidth. However, as the number of SMs 440 within each processing tile 110 increases, the routing distance across the processor die 110 to contacts of the conductive paths provided by the interconnection structure between the processing tile 110 and corresponding memory tile(s) 105. The access energy of the routing also increases with the distance. In an embodiment, the routing energy is 40 fJ/bit-mm. In an embodiment, when the processing tile 110 includes a single SM 440, the average access distance is 1 mm (40 fJ/b). In an embodiment, when the processing tile 110 includes four SMs 440, the average access distance is 2 mm (80 fJ/b). In an embodiment, when the processing tile 110 includes 16 SMs 440, the average access distance is 4 mm (160 fJ/b).

The hierarchical network provides a second level of bandwidth and latency through the tile network 214 within the die stack 100 or 220 for accesses between each processing tile 115 and the local memory tile(s) 105 that are not directly coupled to the processing tile 115 through the tile stack interconnection structure. The second level may be implemented using I/O circuitry at the perimeter of the processing tiles 115. In an embodiment, the second level is provided by a tile communication network (e.g., tile network 214) that is fabricated in the processor die 110 for transmitting data between a first one of the processing tiles 115 and the memory tile 105 corresponding to a second one of the processing tiles 115. In an embodiment, the first and second levels provide equal bandwidth.

The hierarchical network provides a third level of bandwidth and latency through the tile network 214 and the stack gateway 125 for accesses between a processing tile 115 and the memory tiles 105 in other die stacks 100 or 220 on the same interposer 225 (within the same device or package). In an embodiment, one or more stack communication gateway(s) (e.g., stack gateway 125) is fabricated in the processor die 110 for transmitting data between the die stack 100 or 220 and at least one additional die stack 100 or 220, where a device includes the die stack 100 or 220 and the at least one additional die stack 100 or 220. The third level of the hierarchical network may be implemented using I/O circuitry at the perimeter of the processor die 110 (bandwidth varies according to the die position on the interposer 225). For example, a bandwidth density of 2 Tb/s-mm at 0.2 pJ/b may be provided between die stacks on the same interposer, giving 4 TBytes/sec on each "internal" die edge. For an interposer comprising nine die stacks, the central processor die 110 has 16 TBytes/sec off die bandwidth, the four edge dies have 12 TBytes/sec of on-interposer bandwidth, and the four corner dies have 8 TBytes/sec of on-interposer bandwidth.

When two or more devices are included in a system, the hierarchical network provides a fourth level of bandwidth and latency through the tile network 214, stack gateway 125, and package gateway 130 for accesses between a processing tile 115 and the memory tiles 105 in die stacks 100 or 220 on different interposers 225. The fourth level of the hierarchical network may be implemented using I/O circuitry on the perimeter of the interposer 225. For connections off the interposer or package, the "external" die edges (die stacks on the interposer perimeter) a bandwidth density of 0.4 Tb/s-mm at 1 pJ/b may be provided, giving 0.8 TBytes/sec per edge and a total of 9.6 TBytes/sec off the interposer. In an embodiment, the package gateway 130 is implemented with co-packaged optics on the interposer. In an embodiment, an indirect network (e.g., a folded-Clos or dragonfly network) is implemented by the package gateway 130 using explicit switch circuits for "through traffic" of more than a few packages.

In one embodiment, the hierarchical network may use a bandwidth taper, providing higher bandwidth to other local memory tile(s) 105 on the same die stack 100 or 220, lower bandwidth to memory tiles 105 on other die stacks 100 or 220 on the same interposer 225 within a package, and yet lower bandwidth to memory tiles 105 on other packages. In an embodiment, the bandwidth provided at the third level is 4 TBytes/sec. In an embodiment, the bandwidth provided at the fourth level is 9.6 TBytes/sec.

In an embodiment, a topology of one or more of the levels of the hierarchical network and/or bandwidth taper can be set to match application needs. In an embodiment, the first and second levels of the hierarchical network provide a 2D mesh network with 80 Byte wide channels for the wide sub-network and 4 Byte-wide channels for the narrow sub-network. Such a 2D mesh network provides a 5.3:1 taper for memory access to a local memory tile 105 coupled to a corresponding processing tile 115 through the stack interconnection structure (first level) to memory access to other local memory tiles 105 in the same processor die 110 (second level).

Communication between die stacks 100 or 220 implemented via the stack gateway 125 may include a network unit that shifts between channels of different bandwidth. Similarly, communication between the interposers 225 implemented via the package gateway 130 may include a network unit that shifts between channels of different bandwidth. The resulting system including at least one die stack 100 or 200 has a much higher ratio of bytes from memory for every floating-point operation performed (B:F) compared with conventional systems. For example, a system including multiple die stacks 100 or 200 with a hierarchical network may provide a B:F of 4 compared with 0.075 for a conventional HPC system.

In an embodiment, bulk DRAM or other storage is connected to the package gateway 130 via a network memory controller. The bulk DRAM can provide a larger (and less expensive per bit) memory, but with a bandwidth that is at least two orders of magnitude smaller than the local memory tile bandwidth. In an embodiment, the die stacks 220 are combined on an organic substrate rather than the interposer 225 to reduce cost, but at the expense of lower bandwidth at the package or device level of the hierarchy.

In one embodiment, the memory bandwidth advantage resulting from the hierarchical, stacked memory system comprising a die stack 220 (or the die stack 100) is utilized by co-locating threads and data so that most of the memory accesses made by a given thread access the local memory tile(s) 105. For regular codes this can be done by subdividing N-dimensional matrices into N-dimensional sub-matrices in each local region. For irregular codes this may be accomplished by partitioning the cells and launching a thread at the location of the cell it is operating on. Additionally, in one embodiment, a mapping unit/module, such as the mapper 212, may route address bits into tile address and local address, which facilitates interleaving in a manner that preserves locality for N-dimensional matrices.

For example, the mapper 212 may interpret an address-space identifier (ASID) and high address bits within a virtual address included within a request as a segment number that is used to look up a segment descriptor. In another embodiment, the segment descriptor may have a plurality of fields. Table 1 illustrates exemplary segment descriptor fields in accordance with one exemplary embodiment.

TABLE 1

| | |
|---|---|
| BT: Base tile | The segment starts on this tile |
| BA: Base address | The segment starts at this location in the base tile |
| L: Length | The length of the segment in bytes—accesses beyond the length raise an exception. |
| L1: Bits per tile 1 | The log base 2 of the number of cache lines per tile on the first interleave |
| T1: Tile bits 1 | The number of bits used to select a tile on the first interleave |
| L2: Bits per tile 2 | The number of bits used to select a location within the tile on the second interleave |
| T2: Tile bits 2 | The number of bits used to select a tile on the second interleave |
| L3: Bits per tile 3 | The number of bits used to select a location within the tile on the third interleave |

Figure 2E:
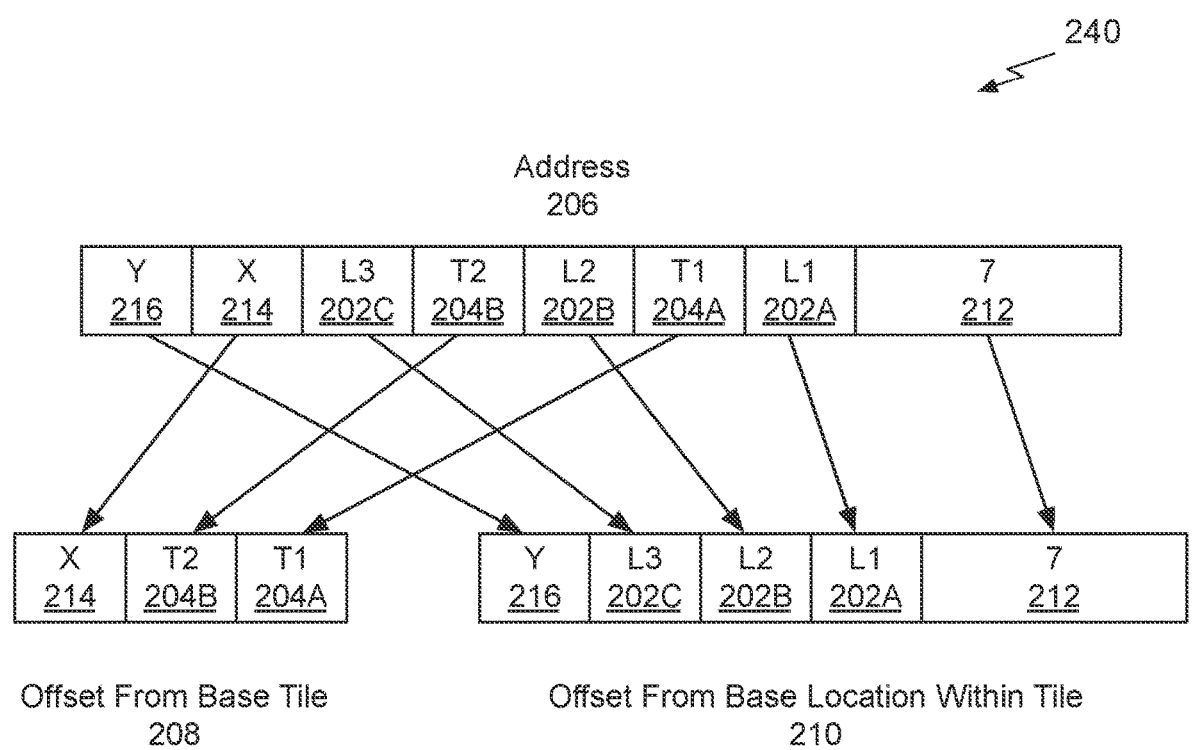
FIG. 2E illustrates an exemplary mapping for a 3D matrix, in accordance with an embodiment.

FIG. 2E illustrates an exemplary mapping 240 for a 3D matrix, in accordance with an embodiment. As shown, the Lx bits and Tx bits of a segment descriptor describe how to use bits of the address 206 to form a tile address and a location within the tile. In one embodiment each L and T field of the segment descriptor is 6 bits in length to allow arbitrary mapping of a 64-bit address. These fields of the segment descriptor specify the widths of bit fields that are alternately used to form the offset from base tile 208 and the offset from base location within tile 210. The bottom L1 bit 202A and +7 bits 212 are location bits. The next T1 bits 204A are tile bits, followed by L2 location bits 202B, T2 tile bits 204B, and L3 location bits 202C. The next X bits 214 are tile bits—where T1 204A+T2 204B+X 214 is the base-2 log of the number of tiles allocated. The remaining bits (Y 216) are location bits.

Based on a mapping of the address 206, the local address is calculated as follows:

$$LA=BA+A[0:L1+6]:A[L1+T1+7:L1+T1+L2+6]:A[L1+T1+L2+T2+7:L1+T1+L2+T2+L3+6]+TileQuotient$$

Additionally, the tile is selected as follows:

$$T=(BT+A[L1+7:L1+T1+6]:A[L1+T1+L2+7:L1+T1+L2+T2+6]:A[L1+T1+L2+T2+L3+7:*]) \% \text{NumTiles}$$

In one embodiment, if it is desired to map a segment so address bits 12-15 select the "x" coordinate of a tile and address bits 24-27 select a "y" coordinate of a tile, bits 0-11 and 16-23 may be concatenated to form the address within the tile. The segment descriptor may be set with L1=4, T1=4, L2=4, T2=4, L3=0.

Also, in one embodiment, the tile address may be computed by computing a modulo of the number of tiles (e.g., the remainder of dividing the tile address by the number of tiles, which must be a power of 2). The quotient of this division may be appended to the local address. This is shown as the division of the upper bits into the X field 214 and Y field 216 in FIG. 2E.

In an embodiment, the mapper 214 identifies a portion of the virtual address as the segment number. Of course, however, in one embodiment the segment number may be derived from the virtual address without being a fixed field (e.g., a portion) of the virtual address. In another embodiment, the portion may include the ASID and the high address bits (a predetermined high portion) of the virtual address. In an embodiment, the mapper 214 locates a segment descriptor in a lookup table, utilizing the segment number. In one embodiment, the lookup table may be associative, indexed, etc.

In an embodiment, using the segment descriptor, the mapper 214 identifies a data storage entity (local memory tile(s) 105 or local memory block) and a starting location within the data storage entity. In one embodiment, the mapper 214 may use the segment descriptor to identify a data storage sub-system containing the data storage entity. In another embodiment, the identified data storage entity and starting location within the data storage entity may include a location where the data read or write is to be performed. In yet another embodiment, the data storage entity may include a memory block. For example, the memory block may include an individual memory tile 105 that is located in a memory die 120 of one or more memory die 120 that are stacked on top of a processor die 110.

Also, in one embodiment, the data storage entity may include any hardware and/or circuitry for storing data, such as flash memory, a storage disk, a solid-state drive, etc. In another embodiment, the data storage entity may be co-located with the processing unit 208 that sent the request. In yet another embodiment, the segment descriptor may indicate how to use the bits of the virtual address to identify a data storage sub-system (e.g., a tile, etc.) via a sub-system address (e.g., a tile address) and an offset location within a corresponding data storage entity of the data storage sub-system where the data is located.

For example, a first number of predetermined bits within the segment descriptor may be used to determine an offset from a base data storage sub-system (e.g., to identify a data storage sub-system that stores the data associated with the memory request). In another example, a second number of predetermined bits within the segment descriptor may be used to determine an offset from a base location within the identified data storage sub-system (e.g., to identify a location within a data storage entity that stores the data associated with the memory request).

In addition, in one embodiment, the segment descriptor may be associated with a predetermined memory segment. For example, the memory segment may include a portion of a memory block allocated for specific data (e.g., a specific N-dimensional array). In another example, the specific data may be associated with a predetermined portion of a computation task (e.g., a sub-volume of a 3D physics simulation, a sub-matrix of a matrix calculation, etc.). In another embodiment, the lookup table may include segment descriptors for a plurality of different memory segments.

In an embodiment, the mapper 214 implements the request utilizing the identified data storage entity and starting location within the data storage entity. In one embodiment, the mapper 214 may translate the memory request to identify the data storage entity and the starting location within the data storage entity. In another embodiment, the mapper 214 may send the translated memory request to the data storage entity for implementation by the data storage entity.

In this way, the mapper 214 may translate a memory request received from a processor for implementation at a data storage entity. The translating may identify a data storage entity and a starting location within the data storage entity where the data associated with the memory request is located. This data storage entity may be co-located with the processing unit 208 that sent the request. This may enable the localization of memory, which may improve the performance of memory usage by reducing an energy of data access and increasing data bandwidth.

Figure 3A:
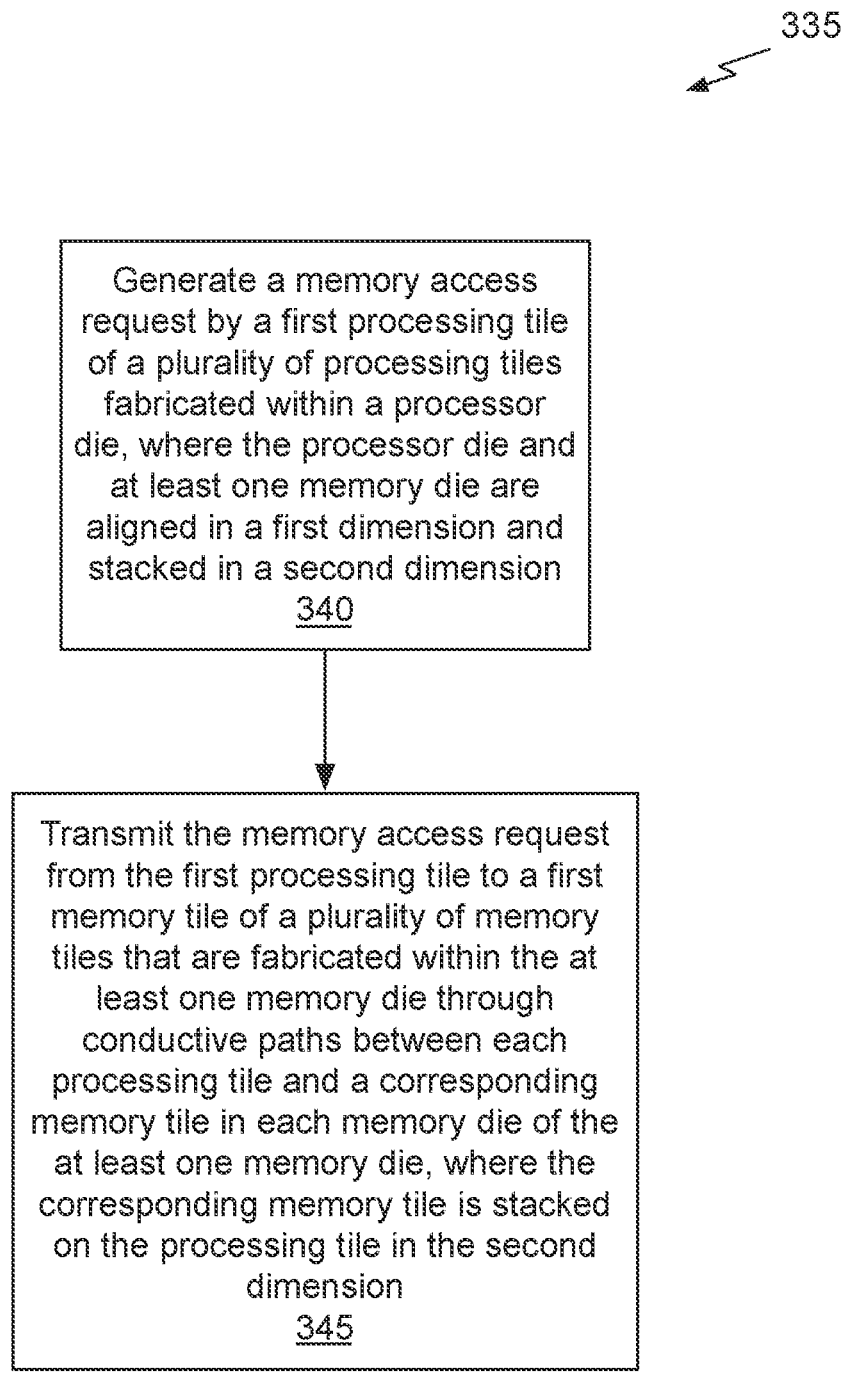
FIG. 3A illustrates a flowchart of a method for accessing memory stacked on processor for high bandwidth, in accordance with an embodiment.

FIG. 3A illustrates a flowchart of a method 335 for accessing memory stacked on a processor for high bandwidth, in accordance with an embodiment. Each block of method 335, described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, method 335 is described, by way of example, with respect to the die stacks 100 and 220, the tile stack 200, and the system 230. However, this method may additionally or alternatively be executed by any one system, or any combination of systems, including, but not limited to, those described herein. Furthermore, persons of ordinary skill in the art will understand that any system that performs method 320 is within the scope and spirit of embodiments of the present disclosure.

At step 340 a memory access request is generated by a first processing tile 115 of a plurality of processing tiles 115 that are fabricated within a processor die 110, where the processor die 110 and at least one memory die 120 are aligned in a first dimension and stacked in a second dimension. In an embodiment, the processor die 110 and the at least one memory die 120 are aligned in a horizontal dimension and stacked in a vertical dimension to form a die stack (stack of dies), such as the die stack 100. In an embodiment, the memory access request is a request to read data from memory or write data to memory.

In an embodiment, the stack of dies further includes at least one interposer substrate that is aligned in the first dimension and stacked in the second dimension. In an embodiment, the at least one interposer substrate is stacked between the processor die 110 and the at least one memory die 120. In an embodiment, the at least one interposer substrate is stacked under the processor die 110. In an embodiment, the stack of dies and at least one additional stack of dies are aligned in the first dimension and affixed to the at least one interposer substrate.

At step 345, the memory access request is transmitted from the first processing tile 115 to a first memory tile 105 of a plurality of memory tiles 105 that are fabricated within the at least one memory die 120. The memory access request is transmitted through first conductive paths of a plurality of conductive paths between each processing tile 115 and a corresponding memory tile 105 in each memory die 120 of the at least one memory die 120, where the corresponding memory tile 105 is stacked on the processing tile 115 in the second dimension.

In an embodiment, the plurality of conductive paths each comprise a through-die via structure in the second dimension that is fabricated within each one of the at least one memory die 120 for communication between each processing tile 115 and the corresponding memory tile 105. In an embodiment, the through-die via structure comprises at least one of through-silicon vias, solder bumps, or hybrid bonds. In an embodiment, the through-die via structure is coupled to the processor die 110 at locations distributed in at least the first direction within a perimeter of each processing tile 115. In an embodiment, the through-die via structure is coupled to the at least one memory die 120 at locations distributed in at least the first direction within each memory tile 105 perimeter. For example, memory cells may be located between the perimeter of the memory tile 105 and the through-die via structures.

In an embodiment, each processing tile 115 comprises a mapping circuit configured to translate an address generated by the processing tile 115 to a location in a local memory block comprising the corresponding memory tile 105 in each memory die 120 of the at least one memory die 120. In an embodiment, each processing tile 115 comprises a mapping circuit configured to translate an address generated by the processing tile 115 to a location in one of a local memory block comprising the corresponding memory tile 105 in each memory die 120 of the at least one memory die 120, the local memory block of a different processing tile 115 within the processor die 110, an additional stack of dies that is included within the device, or an additional stack of dies that is external to the device. In an embodiment, each processing tile 115 comprises an interface to a communication network (e.g., inter-tile network) between the processing tiles 115 for accessing at least one of the local memory block of the different processing tile 115 within the processor die 110, the additional stack of dies that is included within the device, or the additional stack of dies that is external to the device and conductive connections for the interface are disposed along a perimeter of the processing tile 115. In an embodiment, the processor die 110 comprises an interface to a communication network (e.g., stack gateway 125) and conductive connections for the interface are disposed along a perimeter of the processor die 110.

In an embodiment, the stack of dies is enclosed within an integrated circuit package. In an embodiment, the integrated circuit package encloses the stack of dies to produce a device. In an embodiment, the processor die 110 comprises a GPU. In an embodiment, the at least one memory die 120 comprises a first memory die 120 that is disposed between the processor die 110 and a second memory die 120. In an embodiment, a first interface of the first memory die 120 is directly coupled to an interface of at least one processing tile 115 of the plurality of processing tiles 115 and a second interface of the second memory die 120 is indirectly coupled to the at least one processing tile 115 by a through-die via structure fabricated within the first memory die 120.

Stacking one or more memory die 120 on a processor die 110 provides each processing tile 115 with a local memory block comprising the memory tiles 105 that are vertically aligned with the processing tile 115 and directly coupled to the processing tile 115 through interconnection structures. Each channel of the at least one memory die 120 may be accessed by separate I/O circuitry (per-memory tile 105) coupled to a per-processing tile 115 memory controller. The memory tiles 105 and processing tiles 115 are distributed over the area of the memory die 120 and the processor die 110, respectively. The ratio of memory bandwidth (bytes/second) to floating-point operations/second (B:F) may improve 50× for accessing the local memory block compared with conventional memory. Additionally, the energy consumed to transfer each bit between the processing tile 115 and the local memory block may be reduced by 10×.

Figure 3B:
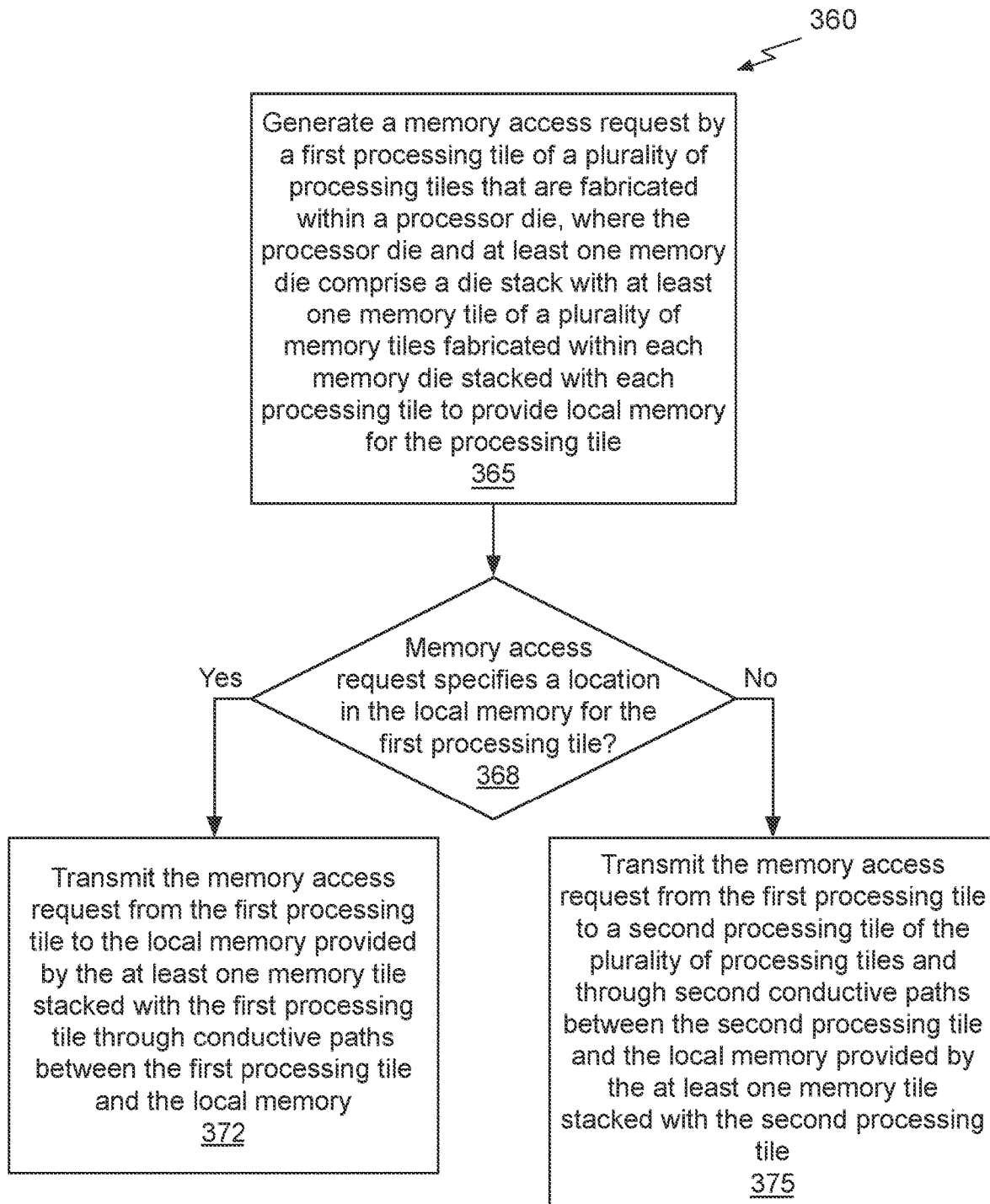
FIG. 3B illustrates a flowchart of a method for accessing memory stacked on a processor through a hierarchical network, in accordance with an embodiment.

FIG. 3B illustrates a flowchart of a method 360 for accessing memory stacked on a processor through a hierarchical network, in accordance with an embodiment. Each block of method 350, described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, method 360 is described, by way of example, with respect to the die stacks 100 and 220, the tile stack 200, and the system 230. However, this method may additionally or alternatively be executed by any one system, or any combination of systems, including, but not limited to, those described herein. Furthermore, persons of ordinary skill in the art will understand that any system that performs method 360 is within the scope and spirit of embodiments of the present disclosure.

At step 365, a memory access request is generated by a first processing tile of a plurality of processing tiles that are fabricated within a processor die, where the processor die and at least one memory die comprise a die stack with at least one memory tile of a plurality of memory tiles fabricated within each memory die stacked with each processing tile to provide local memory for the processing tile.

At step 368, the tile network 214 determines if the memory access request specifies a location in the local memory for the first processing tile. If the memory access request does specify a location in the local memory for the first processing tile, then at step 372, the memory access request is transmitted from the first processing tile to the local memory provided by the at least one memory tile stacked with the first processing tile through conductive paths between the first processing tile and the local memory. Otherwise, at step 375, the memory access request is transmitted from the first processing tile to a second processing tile of the plurality of processing tiles and through second conductive paths between the second processing tile and the local memory provided by the at least one memory tile stacked with the second processing tile.

The hierarchical network provides access paths through the interconnection structure for each processing tile 115 to access the processing tile's local memory block, the local memory block coupled to a different processing tile 115 within the same processor die 110, memory tiles 105 in a different die stack, and memory tiles 105 in a different device. In an embodiment, the bandwidth between each SM and the local memory tiles is 400 GB/s. A memory access generated by a processing tile 115 may be translated to a memory tile address in the local memory tile(s) directly coupled to the processing unit 208, local memory tile(s) 105 within the same die stack (directly coupled to a different processing unit 208 in the same die), memory tiles 105 in a different stack (on the same interposer), or memory tiles 105 in a different device. In an embodiment, the hierarchical network provides the highest bandwidth and lowest latency at a first level through the interconnection structure between each processing tile 115 and the local memory tile(s) 105. In an embodiment, the hierarchical network is capable of saturating the bandwidth available at the I/O circuitry at the perimeter of the processor die 110. In an embodiment, the hierarchical network is capable of saturating the bandwidth available at the I/O circuitry at the perimeter of the interposer.

Application Partitioning for Locality in a Stacked Memory System

A stacked memory system increases the memory bandwidth available for each floating-point operation when local memory blocks are accessed during execution of an application program. Conventional execution of the application does not constrain execution to access local memory blocks because the intermediate data may be stored in non-local memory blocks. A technique for partitioning an application program ensures local memory blocks of a stacked memory system store data that are accessed most frequently during execution. In particular, dense static arrays are partitioned for execution by processing tiles that are each associated with a local memory block of memory tiles stacked on the processing tile. In other words, the dense static arrays may be "tiled" across the processing and memory tiles in one, two, or three dimensions.

At least a portion of the local memory block for a processing tile is mapped to an address space for storing state of a slice (partition) of a processing workload executed by the processing tile. Other portions of the local memory block may be mapped for use as a cache or storage for shared data that may be accessed by other processing tiles. The hierarchical network provides access paths for each processing tile to access the processing tile's local memory block, the local memory block coupled to a different processing tile within the same processing die, memory tiles in a different die stack, and memory tiles in an external device or package. However, the memory bandwidth may decrease significantly when a processing tile accesses a memory tile in a different die stack or device.

An application program that operates on dense 2D or 3D arrays (matrices) may partition the dense arrays into sub-arrays that are associated with program tiles. In an embodiment, the partitioning is based on the size of the array and the number of processing tiles. Each program tile is executed by a processing tile using the processing tile's local memory block to process the associated sub-array. In an embodiment, a compiler partitions an array into the sub-arrays and instantiates a portion of the application program (one or more array operations) to produce program tiles (e.g., loop iterations) that each operate on a sub-array. The data associated with each sub-array is stored in a local memory block and the processing tile corresponding to the local memory block executes the program tile to process the sub-array data. TABLE 2 illustrates additional steps for partitioning an application program that includes an array operation.

TABLE 2

| Steps for partitioning an array operation |
|---|
| A=array... |
| B=array... |
|    Partition A and B into sub-arrays sized to fit in each local memory block |
|    Store the sub-arrays into the local memory blocks |
|    Instantiate program tiles for execution by processing tiles to compute sub-arrays of C |
| C=operation(A,B) |

To utilize the high local bandwidth of the local memory blocks, the following commands may be specified to declare a 2D array with dimensions M×N and map the 2D array onto X×X sub-arrays each of M/X×N/X:

double a[M][N];
    map a[X][X];

The mapping unit described above supports access into the sub-array structures with linear addresses.

To benefit from the higher bandwidth access of the local memory blocks, a loop nest operating on array "a" may be divided into sub-loops for each program tile for parallel execution on a corresponding processing tile. In an embodiment, the compiler performs the mechanical division to produce the program tiles. If a thread operates on like indices of multiple dense sub-arrays, the indices may be aligned so that the thread accesses the local memory block to process the sub-arrays.

Once the data for an operation are explicitly stored in the memory tiles comprising the local memory block(s), threads may execute the program tiles on the processing tile(s) corresponding to the local memory block(s). Storing the data may be done implicitly or explicitly. Consider a M×V loop:

```
forall j = 0..N-1
    forall i = 0..M-1
        o[i] += a[i][j] * v[j] ; // reduction
```

With array "a" mapped as above, the compiler may instantiate a portion of the application program that comprises the array operation into $X^2$ program tiles (e.g., sub-loops), one for each processing tile. Each of the program tiles may be executed on the processing tile that is co-located with the portion of data to be processed by the processing tile, as shown below.

```
forall tx = 0..X-1
    forall ty = 0..Y-1
        forall i = 0..NX-1
            forall j = 0..NY-1
                ol[i+ty*NY][tx] += a[i+ty*NY][j+tx*NX]*v[j+tx*NX];
forall tx = 0..X-1
    forall ty = 0..Y-1
        forall i = 0..NY-1
            o[i+ty*NY] += ol[i+ty*NY][tx] ;
```

For irregular codes (e.g., certain fluids codes), graph structures may be partitioned into program tiles using standard graph-partitioning software. This may be accomplished by declaring the structures as a 1D array and mapping as described above. Codes with inherent 3D structure (e.g., the grid of a fluid code) may achieve high locality in this manner. Once the structure is partitioned, threads may execute the program tiles on the processing tile(s) corresponding to the local memory block(s) where the element of the structure being processed is stored. In the following loop:

forall control volume in volumes
    evaluate flux(control volume)

Each invocation of procedure evaluate flux launches a thread on the processing tile co-located with the argument. Sufficient threads may be located on each processing tile to fill a thread array of sufficient size to keep the processing tile busy. Each of these threads may make references to adjacent (in the grid) control volumes. However, in an embodiment, a majority of the references will be local references, and the remainder are cached.

An allocation mechanism that specifies location may be used to localize individual control volumes. In one embodiment, localization may be accomplished by allocating a tiled 1D array (which allocates a contiguous fraction of the array to each processing tile) and then remapping the control volumes into the processing tiles. For example, a grid may be initially read as an array of neighbor lists. A partitioner may then be run on the grid to assign each node to a processing tile. The node assignment sets the processing tile for each node (i.e., associates the node with a specific processing tile) in the example code below.

The node array may then be scanned to assign each node an offset within the processing tile associated with the node using the auxiliary array last_offset that records the last offset assigned for each processing tile. Next, the neighbor lists may be fixed to point to the new location for each node (tile*TILE_SZ+offset). Each node may then be placed at the index where the node belongs by using temp_node to hold the node displaced by the last node moved, as shown below.

```
typedef struct node {
    int neighbor[4] ;
    int tile ;
    int offset ;
    ...
} node_t ;
node_t nodes[NR_NODES] ;
int last_offset[NR_TILES] ;
node_t temp_node ;
read_graph(nodes) ;
partition_graph(nodes) ;
assign_offsets(nodes) ;
fix_pointers(nodes) ;
shuffle_nodes(nodes) ;
```

Each of the routines read_graph, partition_graph, assign_offsets, fix_pointers, and shuffle_nodes may be executed in parallel using a temp_node per worker and ensuring that the updates to last_offset are atomic.

When the array is sparse or an irregular data structure, graph partitioning may be used to co-locate the program tiles (executed by threads) with the sub-arrays. In an embodiment, message-driven processing can be used to create threads for execution by the processing tile corresponding to the local memory block where the sub-array data is stored. In an embodiment, when a thread will operate on data that is not stored in the local memory block, the thread may be migrated to execute on a different processing tile that corresponds to the local memory block where the data is stored. In an embodiment, when a thread will operate on data that is not stored in the local memory block, a portion of the execution state, such as a number of parameters, are transferred (e.g., migrated) from a first processing tile to a second processing tile that corresponds to the local memory block where the data is stored to perform a thread remote procedure call. A function that accesses the data may then be executed on the second processing tile and, if needed, some data may be returned to the first processing tile upon completion. In an embodiment, the thread remote procedure call is synchronous meaning that execution of the thread on the first processing tile is suspended until the requested work executed on the second processing tile is completed. In an embodiment, the thread remote procedure call is asynchronous meaning that execution of the thread on the first processing tile continues executing, potentially in parallel with the requested work executed on the second processing tile. In an embodiment, explicit coordination via semaphores or other primitives may be used to coordinate between the first and second processing tiles. The thread remote procedure call effectively migrates a portion of the thread to a different processing tile for synchronous or asynchronous execution.

Figure 3C:
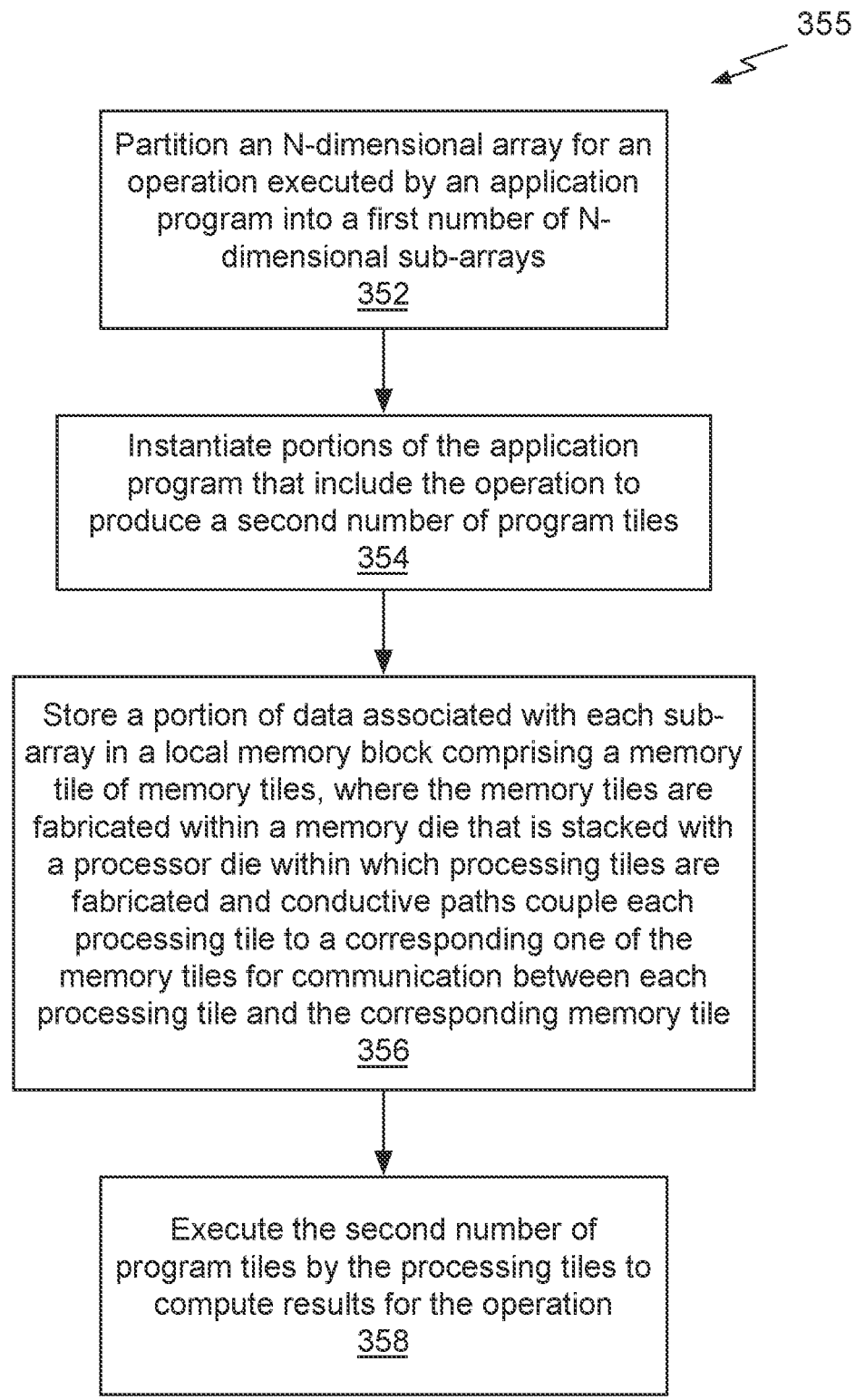
FIG. 3C illustrates a flowchart of a method for executing an application program by a stacked memory system, in accordance with an embodiment.

FIG. 3C illustrates a flowchart of a method 355 for executing an application program by a stacked memory system, in accordance with an embodiment. Each block of method 350, described herein, comprises a computing process that may be performed using any combination of hardware, firmware, and/or software. For instance, various functions may be carried out by a processor executing instructions stored in memory. The method may also be embodied as computer-usable instructions stored on computer storage media. The method may be provided by a standalone application, a service or hosted service (standalone or in combination with another hosted service), or a plug-in to another product, to name a few. In addition, method 355 is described, by way of example, with respect to the die stacks 100 and 220, the tile stack 200, and the system 230. However, this method may additionally or alternatively be executed by any one system, or any combination of systems, including, but not limited to, those described herein. Furthermore, persons of ordinary skill in the art will understand that any system that performs method 355 is within the scope and spirit of embodiments of the present disclosure.

At step 352, an N-dimensional array for an operation executed by the application program is partitioned into a first number of N-dimensional sub-arrays. In an embodiment, N=2, the array is M×P, the first number is X and equals a quantity of the processing tiles, and each 2-dimensional sub-array is M/X×P/X. In an embodiment, the second number of the program tiles is $X^2$. At step 354, portions of the application program that include the operation are instantiated to produce a second number of program tiles.

At step 356, a portion of data associated with each sub-array is stored in a local memory block comprising a memory tile of memory tiles, where the memory tiles are fabricated within a memory die. In an embodiment, the portions of data associated with the sub-arrays are distributed to the memory tiles for processing by a corresponding processing tile. In an embodiment, the portion of data associated with each sub-array or program tile is determined using a graph partitioner. In an embodiment, the memory die is stacked with a processor die within which processing tiles are fabricated and conductive paths couple each processing tile to a corresponding one of the memory tiles for communication between each processing tile and the corresponding memory tile. At step 358, the second number of the program tiles is executed by the processing tiles to compute results for the operation.

In an embodiment, at least one additional memory die is stacked on the memory die and the local memory block for each processing tile comprises the memory tile and additional memory tiles fabricated within the additional memory die that are coupled to the processing tile by the conductive paths. In an embodiment, a tile communication network fabricated in the processor die transmits data between a first processing tile of the processing tiles and a second memory tile of the memory tiles corresponding to a second processing tile of the processing tiles.

In an embodiment, a thread executing on the first processing tile is migrated to the second processing tile for processing of data stored in the second memory tile. In an embodiment, the thread is migrated by transmitting a message with thread state for the thread to the second processing tile and activating a new thread by the second processing tile in response to receiving the message. In an embodiment, a thread remote procedure call migrates a portion of the thread from a first processing tile to a second processing tile for synchronous or asynchronous execution. One or more parameters included in the thread state may be transferred between the first processing tile to the second processing tile to complete the thread remote procedure call.

In an embodiment, a communication network transmits data between a first processing tile of the processing tiles and a second memory die that is stacked on a second processor die. In an embodiment, a thread executing on the first processing tile is migrated to a second processing tile fabricated within the second processor die for processing of data stored in a second memory tile fabricated within the second memory die.

In an embodiment, one or more memory die are stacked on the processor die to provide a stacked memory system and application programs are partitioned for locality in the stacked memory system. An application program that operates on dense multi-dimensional arrays (matrices) may partition the dense arrays into sub-arrays associated with program tiles. Each program tile is executed by a processing tile using the processing tile's local memory block to process the associated sub-array. Data associated with each sub-array is stored in a local memory block and the processing tile corresponding to the local memory block executes the program tile to process the sub-array data.

Figure 3D:
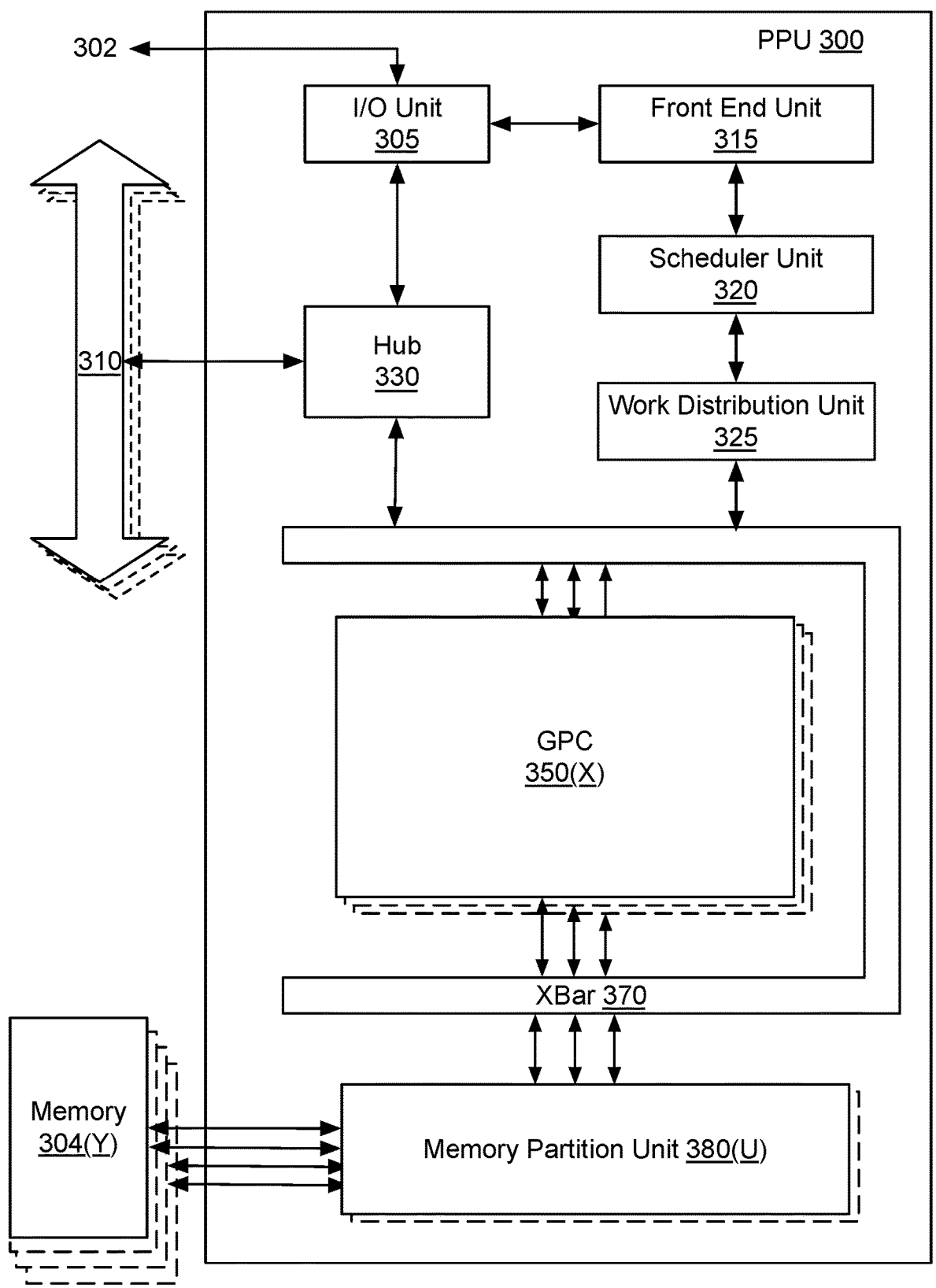
FIG. 3D illustrates an example parallel processing unit suitable for use in implementing some embodiments of the present disclosure.
Figure 5A:
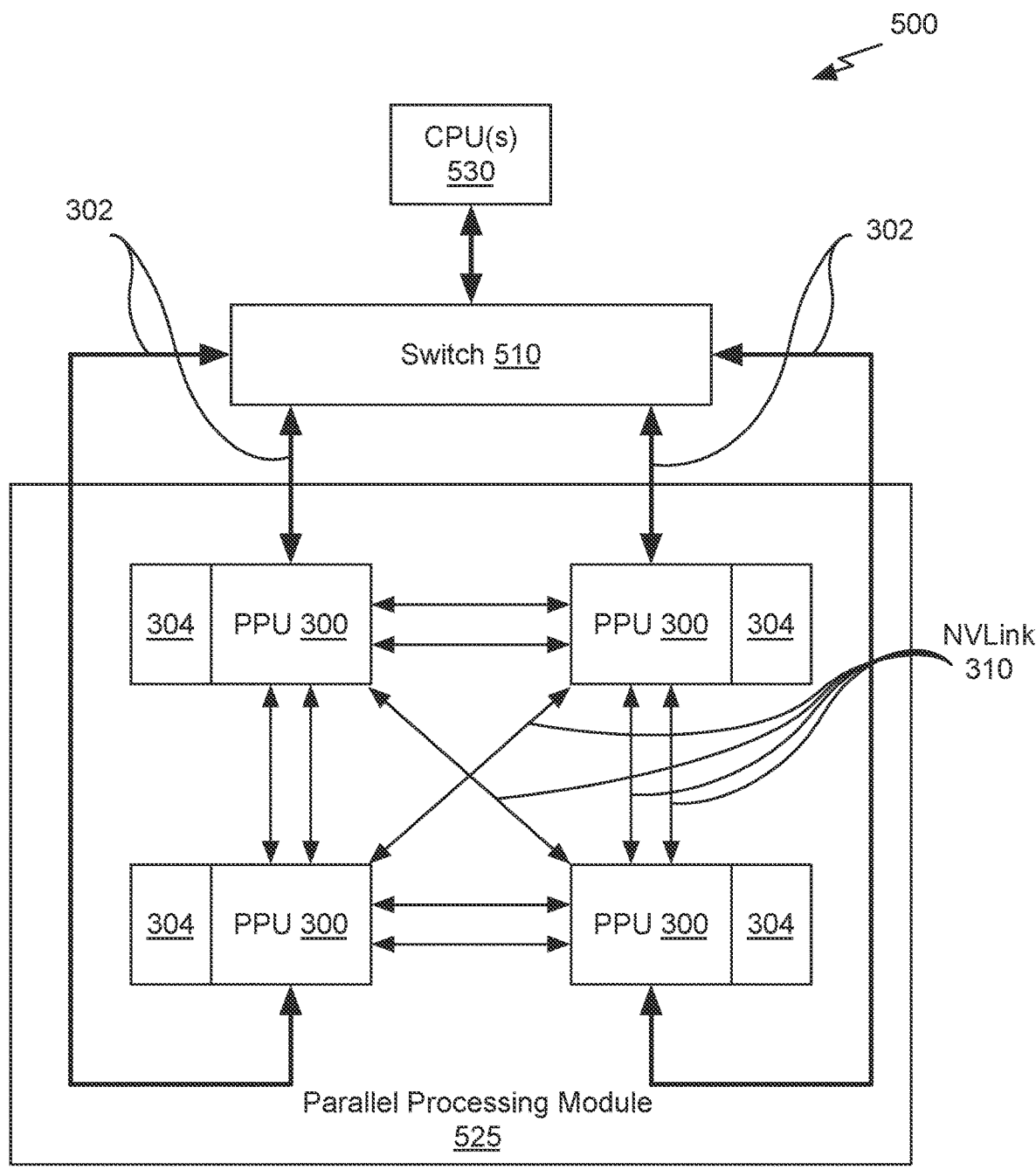
FIG. 5A is a conceptual diagram of a processing system implemented using the PPU of FIG. 3D, suitable for use in implementing some embodiments of the present disclosure.

FIG. 5A is a conceptual diagram of a processing system 500 implemented using the PPU 300 of FIG. 3D, in accordance with an embodiment. The exemplary system 500 may be configured to implement the 335, 360, and/or 355 shown in FIGS. 3A, 3B, and 3C. The processing system 500 includes a CPU 530, switch 510, and multiple PPUs 300, and respective memories 304.

Figure 5B:
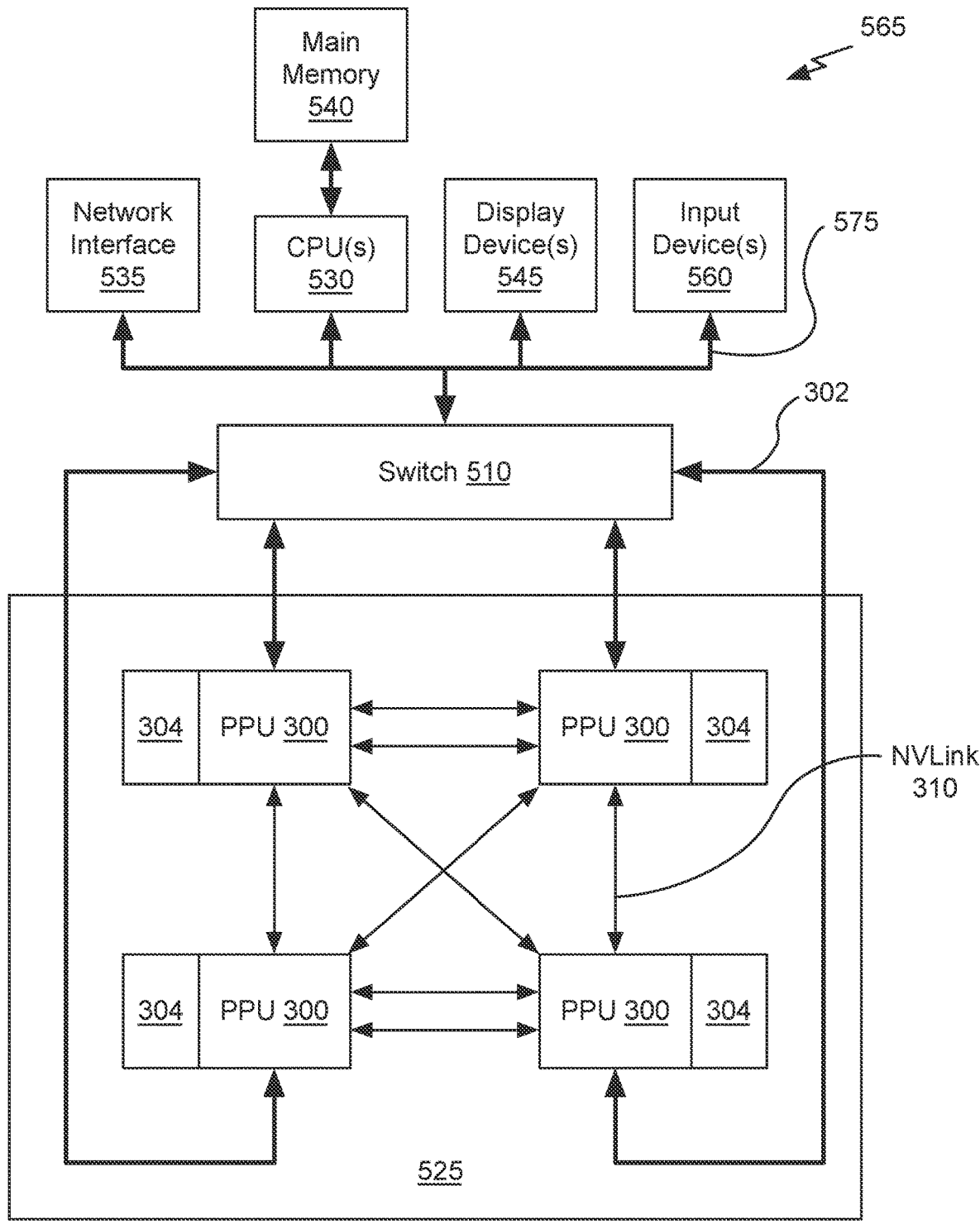
FIG. 5B illustrates an exemplary system in which the various architecture and/or functionality of the various previous embodiments may be implemented.

FIG. 5B illustrates an exemplary system 565 in which the various architecture and/or functionality of the various previous embodiments may be implemented. The exemplary system 565 may be configured to implement the method 335, 360, and/or 355 shown in FIGS. 3A, 3B, and 3C.

Parallel Processing Architecture

FIG. 3C illustrates a parallel processing unit (PPU) 300, in accordance with an embodiment. The PPU 300 may be used to implement the die stack 100 or 220. The PPU 300 may be used to implement the processor die 110. In an embodiment, a processor such as the PPU 300 may be configured to implement a neural network model. The neural network model may be implemented as software instructions executed by the processor or, in other embodiments, the processor can include a matrix of hardware elements configured to process a set of inputs (e.g., electrical signals representing values) to generate a set of outputs, which can represent activations of the neural network model. In yet other embodiments, the neural network model can be implemented as a combination of software instructions and processing performed by a matrix of hardware elements. Implementing the neural network model can include determining a set of parameters for the neural network model through, e.g., supervised or unsupervised training of the neural network model as well as, or in the alternative, performing inference using the set of parameters to process novel sets of inputs.

In an embodiment, the PPU 300 is a multi-threaded processor that is implemented on one or more integrated circuit devices. The PPU 300 is a latency hiding architecture designed to process many threads in parallel. A thread (e.g., a thread of execution) is an instantiation of a set of instructions configured to be executed by the PPU 300. In an embodiment, the PPU 300 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the PPU 300 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more PPUs 300 may be configured to accelerate thousands of High Performance Computing (HPC), data center, cloud computing, and machine learning applications. The PPU 300 may be configured to accelerate numerous deep learning systems and applications for autonomous vehicles, simulation, computational graphics such as ray or path tracing, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 3, the PPU 300 includes an Input/Output (I/O) unit 305, a front end unit 315, a scheduler unit 320, a work distribution unit 325, a hub 330, a crossbar (Xbar) 370, one or more general processing clusters (GPCs) 350, and one or more memory partition units 380. The PPU 300 may be connected to a host processor or other PPUs 300 via one or more high-speed NVLink 310 interconnect. The PPU 300 may be connected to a host processor or other peripheral devices via an interconnect 302. The PPU 300 may also be connected to a local memory 304 comprising a number of memory devices. In an embodiment, the local memory may comprise a number of dynamic random access memory (DRAM) devices. The DRAM devices may be configured as a high-bandwidth memory (HBM) subsystem, with multiple DRAM dies stacked within each device.

The NVLink 310 interconnect enables systems to scale and include one or more PPUs 300 combined with one or more CPUs, supports cache coherence between the PPUs 300 and CPUs, and CPU mastering. Data and/or commands may be transmitted by the NVLink 310 through the hub 330 to/from other units of the PPU 300 such as one or more copy engines, a video encoder, a video decoder, a power management unit, etc. (not explicitly shown). The NVLink 310 is described in more detail in conjunction with FIG. 5A.

The I/O unit 305 is configured to transmit and receive communications (e.g., commands, data, etc.) from a host processor (not shown) over the interconnect 302. The I/O unit 305 may communicate with the host processor directly via the interconnect 302 or through one or more intermediate devices such as a memory bridge. In an embodiment, the I/O unit 305 may communicate with one or more other processors, such as one or more the PPUs 300 via the interconnect 302. In an embodiment, the I/O unit 305 implements a Peripheral Component Interconnect Express (PCIe) interface for communications over a PCIe bus and the interconnect 302 is a PCIe bus. In alternative embodiments, the I/O unit 305 may implement other types of well-known interfaces for communicating with external devices.

The I/O unit 305 decodes packets received via the interconnect 302. In an embodiment, the packets represent commands configured to cause the PPU 300 to perform various operations. The I/O unit 305 transmits the decoded commands to various other units of the PPU 300 as the commands may specify. For example, some commands may be transmitted to the front end unit 315. Other commands may be transmitted to the hub 330 or other units of the PPU 300 such as one or more copy engines, a video encoder, a video decoder, a power management unit, etc. (not explicitly shown). In other words, the I/O unit 305 is configured to route communications between and among the various logical units of the PPU 300.

In an embodiment, a program executed by the host processor encodes a command stream in a buffer that provides workloads to the PPU 300 for processing. A workload may comprise several instructions and data to be processed by those instructions. The buffer is a region in a memory that is accessible (e.g., read/write) by both the host processor and the PPU 300. For example, the I/O unit 305 may be configured to access the buffer in a system memory connected to the interconnect 302 via memory requests transmitted over the interconnect 302. In an embodiment, the host processor writes the command stream to the buffer and then transmits a pointer to the start of the command stream to the PPU 300. The front end unit 315 receives pointers to one or more command streams. The front end unit 315 manages the one or more streams, reading commands from the streams and forwarding commands to the various units of the PPU 300.

The front end unit 315 is coupled to a scheduler unit 320 that configures the various GPCs 350 to process tasks defined by the one or more streams. The scheduler unit 320 is configured to track state information related to the various tasks managed by the scheduler unit 320. The state may indicate which GPC 350 a task is assigned to, whether the task is active or inactive, a priority level associated with the task, and so forth. The scheduler unit 320 manages the execution of a plurality of tasks on the one or more GPCs 350.

The scheduler unit 320 is coupled to a work distribution unit 325 that is configured to dispatch tasks for execution on the GPCs 350. The work distribution unit 325 may track a number of scheduled tasks received from the scheduler unit 320. In an embodiment, the work distribution unit 325 manages a pending task pool and an active task pool for each of the GPCs 350. The pending task pool may comprise a number of slots (e.g., 32 slots) that contain tasks assigned to be processed by a particular GPC 350. The active task pool may comprise a number of slots (e.g., 4 slots) for tasks that are actively being processed by the GPCs 350. As a GPC 350 finishes the execution of a task, that task is evicted from the active task pool for the GPC 350 and one of the other tasks from the pending task pool is selected and scheduled for execution on the GPC 350. If an active task has been idle on the GPC 350, such as while waiting for a data dependency to be resolved, then the active task may be evicted from the GPC 350 and returned to the pending task pool while another task in the pending task pool is selected and scheduled for execution on the GPC 350.

The work distribution unit 325 communicates with the one or more GPCs 350 via XBar 370. The XBar 370 is an interconnect network that couples many of the units of the PPU 300 to other units of the PPU 300. For example, the XBar 370 may be configured to couple the work distribution unit 325 to a particular GPC 350. Although not shown explicitly, one or more other units of the PPU 300 may also be connected to the XBar 370 via the hub 330.

The tasks are managed by the scheduler unit 320 and dispatched to a GPC 350 by the work distribution unit 325. The GPC 350 is configured to process the task and generate results. The results may be consumed by other tasks within the GPC 350, routed to a different GPC 350 via the XBar 370, or stored in the memory 304. The results can be written to the memory 304 via the memory partition units 380, which implement a memory interface for reading and writing data to/from the memory 304. The results can be transmitted to another PPU 300 or CPU via the NVLink 310. In an embodiment, the PPU 300 includes a number U of memory partition units 380 that is equal to the number of separate and distinct memory devices of the memory 304 coupled to the PPU 300. A memory partition unit 380 will be described in more detail below in conjunction with FIG. 4B.

In an embodiment, a host processor executes a driver kernel that implements an application programming interface (API) that enables one or more applications executing on the host processor to schedule operations for execution on the PPU 300. In an embodiment, multiple compute applications are simultaneously executed by the PPU 300 and the PPU 300 provides isolation, quality of service (QoS), and independent address spaces for the multiple compute applications. An application may generate instructions (e.g., API calls) that cause the driver kernel to generate one or more tasks for execution by the PPU 300. The driver kernel outputs tasks to one or more streams being processed by the PPU 300. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 4C.

Figure 4A:
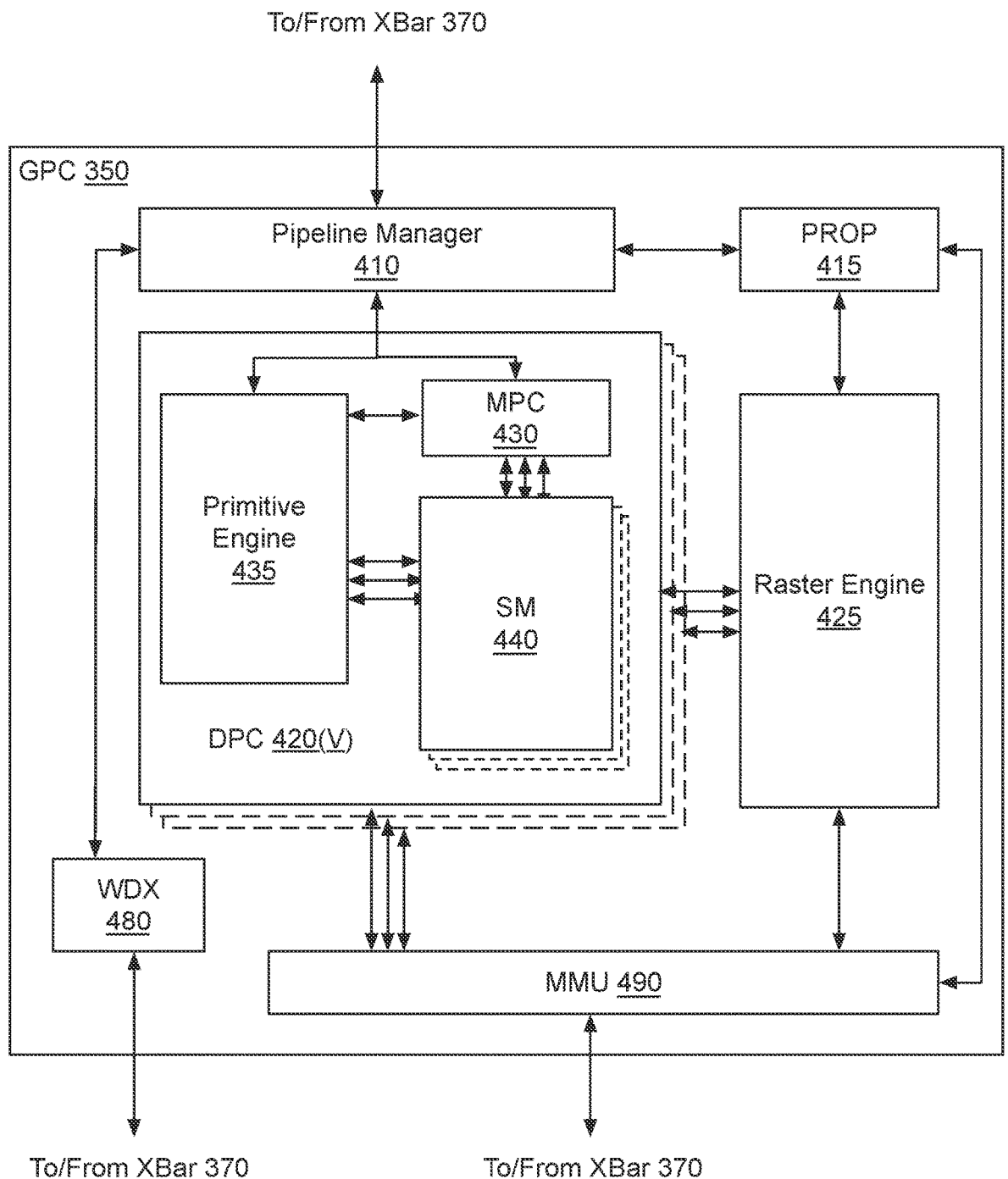
FIG. 4A illustrates an example general processing cluster within the parallel processing unit of FIG. 3D, suitable for use in implementing some embodiments of the present disclosure.

FIG. 4A illustrates a GPC 350 of the PPU 300 of FIG. 3, in accordance with an embodiment. As shown in FIG. 4A, each GPC 350 includes a number of hardware units for processing tasks. In an embodiment, each GPC 350 includes a pipeline manager 410, a pre-raster operations unit (PROP) 415, a raster engine 425, a work distribution crossbar (WDX) 480, a memory management unit (MMU) 490, and one or more Data Processing Clusters (DPCs) 420. It will be appreciated that the GPC 350 of FIG. 4A may include other hardware units in lieu of or in addition to the units shown in FIG. 4A.

In an embodiment, the operation of the GPC 350 is controlled by the pipeline manager 410. The pipeline manager 410 manages the configuration of the one or more DPCs 420 for processing tasks allocated to the GPC 350. In an embodiment, the pipeline manager 410 may configure at least one of the one or more DPCs 420 to implement at least a portion of a graphics rendering pipeline. For example, a DPC 420 may be configured to execute a vertex shader program on the programmable streaming multiprocessor (SM) 440. The pipeline manager 410 may also be configured to route packets received from the work distribution unit 325 to the appropriate logical units within the GPC 350. For example, some packets may be routed to fixed function hardware units in the PROP 415 and/or raster engine 425 while other packets may be routed to the DPCs 420 for processing by the primitive engine 435 or the SM 440. In an embodiment, the pipeline manager 410 may configure at least one of the one or more DPCs 420 to implement a neural network model and/or a computing pipeline.

Figure 4B:
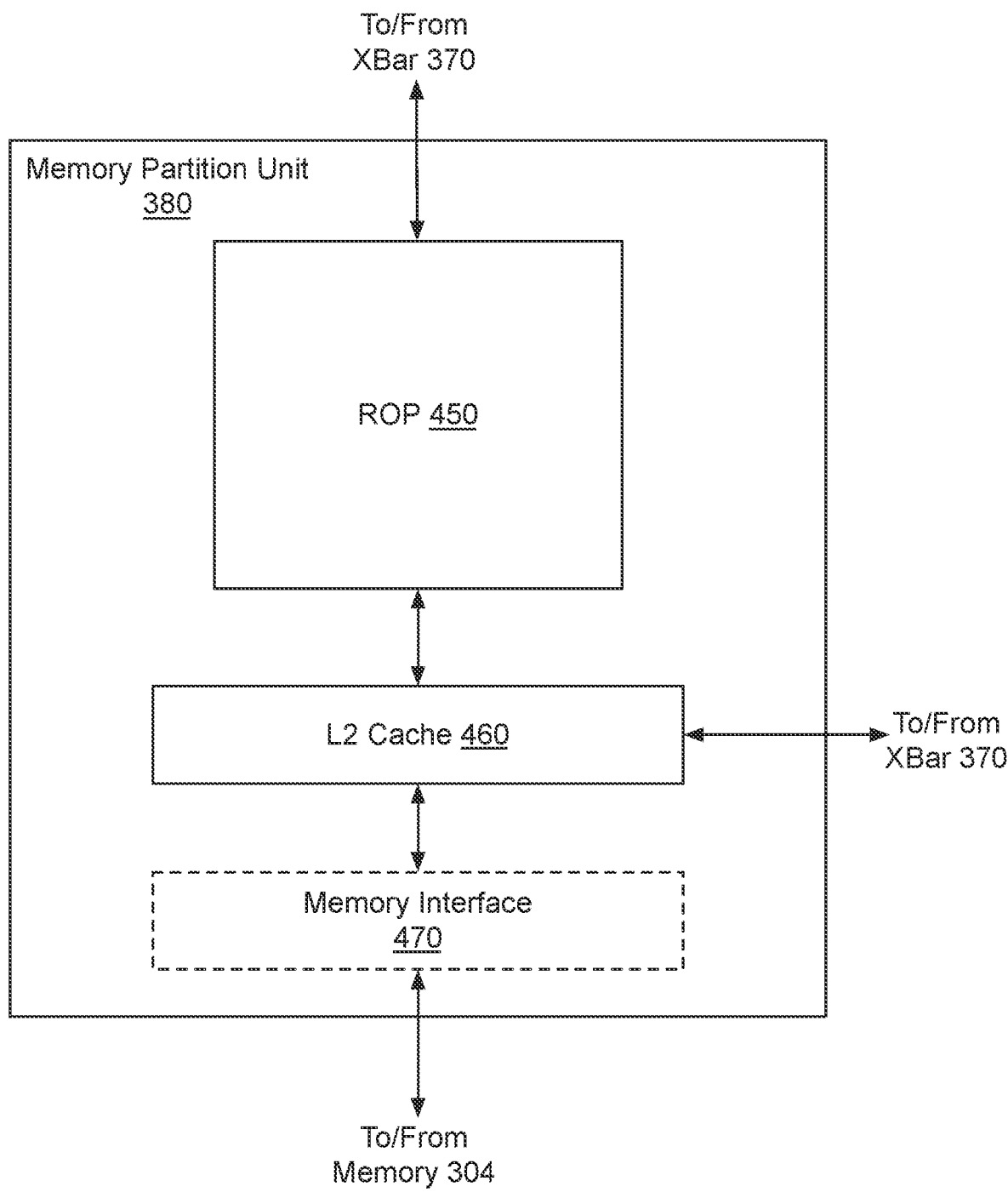
FIG. 4B illustrates an example memory partition unit of the parallel processing unit of FIG. 3D, suitable for use in implementing some embodiments of the present disclosure.

The PROP unit 415 is configured to route data generated by the raster engine 425 and the DPCs 420 to a Raster Operations (ROP) unit, described in more detail in conjunction with FIG. 4B. The PROP unit 415 may also be configured to perform optimizations for color blending, organize pixel data, perform address translations, and the like.

The raster engine 425 includes a number of fixed function hardware units configured to perform various raster operations. In an embodiment, the raster engine 425 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x,y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 425 comprises fragments to be processed, for example, by a fragment shader implemented within a DPC 420.

Each DPC 420 included in the GPC 350 includes an M-Pipe Controller (MPC) 430, a primitive engine 435, and one or more SMs 440. The MPC 430 controls the operation of the DPC 420, routing packets received from the pipeline manager 410 to the appropriate units in the DPC 420. For example, packets associated with a vertex may be routed to the primitive engine 435, which is configured to fetch vertex attributes associated with the vertex from the memory 304. In contrast, packets associated with a shader program may be transmitted to the SM 440.

The SM 440 comprises a programmable streaming processor that is configured to process tasks represented by a number of threads. Each SM 440 is multi-threaded and configured to execute a plurality of threads (e.g., 32 threads) from a particular group of threads concurrently. In an embodiment, the SM 440 implements a SIMD (Single-Instruction, Multiple-Data) architecture where each thread in a group of threads (e.g., a warp) is configured to process a different set of data based on the same set of instructions. All threads in the group of threads execute the same instructions. In another embodiment, the SM 440 implements a SIMT (Single-Instruction, Multiple Thread) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The SM 440 will be described in more detail below in conjunction with FIG. 4C.

The MMU 490 provides an interface between the GPC 350 and the memory partition unit 380. The MMU 490 may provide translation of virtual addresses into physical addresses, memory protection, and arbitration of memory requests. In an embodiment, the MMU 490 provides one or more translation lookaside buffers (TLBs) for performing translation of virtual addresses into physical addresses in the memory 304.

FIG. 4B illustrates a memory partition unit 380 of the PPU 300 of FIG. 3, in accordance with an embodiment. As shown in FIG. 4B, the memory partition unit 380 includes a Raster Operations (ROP) unit 450, a level two (L2) cache 460, and a memory interface 470. The memory interface 470 is coupled to the memory 304. Memory interface 470 may implement 32, 64, 128, 1024-bit data buses, or the like, for high-speed data transfer. In an embodiment, the PPU 300 incorporates U memory interfaces 470, one memory interface 470 per pair of memory partition units 380, where each pair of memory partition units 380 is connected to a corresponding memory device of the memory 304. For example, PPU 300 may be connected to up to Y memory devices, such as high bandwidth memory stacks or graphics double-data-rate, version 5, synchronous dynamic random access memory, or other types of persistent storage.

In an embodiment, the memory interface 470 implements an HBM2 memory interface and Y equals half U. In an embodiment, the HBM2 memory stacks are located on the same physical package as the PPU 300, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 304 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where PPUs 300 process very large datasets and/or run applications for extended periods.

In an embodiment, the PPU 300 implements a multi-level memory hierarchy. In an embodiment, the memory partition unit 380 supports a unified memory to provide a single unified virtual address space for CPU and PPU 300 memory, enabling data sharing between virtual memory systems. In an embodiment the frequency of accesses by a PPU 300 to memory located on other processors is traced to ensure that memory pages are moved to the physical memory of the PPU 300 that is accessing the pages more frequently. In an embodiment, the NVLink 310 supports address translation services allowing the PPU 300 to directly access a CPU's page tables and providing full access to CPU memory by the PPU 300.

In an embodiment, copy engines transfer data between multiple PPUs 300 or between PPUs 300 and CPUs. The copy engines can generate page faults for addresses that are not mapped into the page tables. The memory partition unit 380 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 304 or other system memory may be fetched by the memory partition unit 380 and stored in the L2 cache 460, which is located on-chip and is shared between the various GPCs 350. As shown, each memory partition unit 380 includes a portion of the L2 cache 460 associated with a corresponding memory 304. Lower level caches may then be implemented in various units within the GPCs 350. For example, each of the SMs 440 may implement a level one (L1) cache. The L1 cache is private memory that is dedicated to a particular SM 440. Data from the L2 cache 460 may be fetched and stored in each of the L1 caches for processing in the functional units of the SMs 440. The L2 cache 460 is coupled to the memory interface 470 and the XBar 370.

The ROP unit 450 performs graphics raster operations related to pixel color, such as color compression, pixel blending, and the like. The ROP unit 450 also implements depth testing in conjunction with the raster engine 425, receiving a depth for a sample location associated with a pixel fragment from the culling engine of the raster engine 425. The depth is tested against a corresponding depth in a depth buffer for a sample location associated with the fragment. If the fragment passes the depth test for the sample location, then the ROP unit 450 updates the depth buffer and transmits a result of the depth test to the raster engine 425. It will be appreciated that the number of memory partition units 380 may be different than the number of GPCs 350 and, therefore, each ROP unit 450 may be coupled to each of the GPCs 350. The ROP unit 450 tracks packets received from the different GPCs 350 and determines which GPC 350 that a result generated by the ROP unit 450 is routed to through the Xbar 370. Although the ROP unit 450 is included within the memory partition unit 380 in FIG. 4B, in other embodiment, the ROP unit 450 may be outside of the memory partition unit 380. For example, the ROP unit 450 may reside in the GPC 350 or another unit.

Figure 4C:
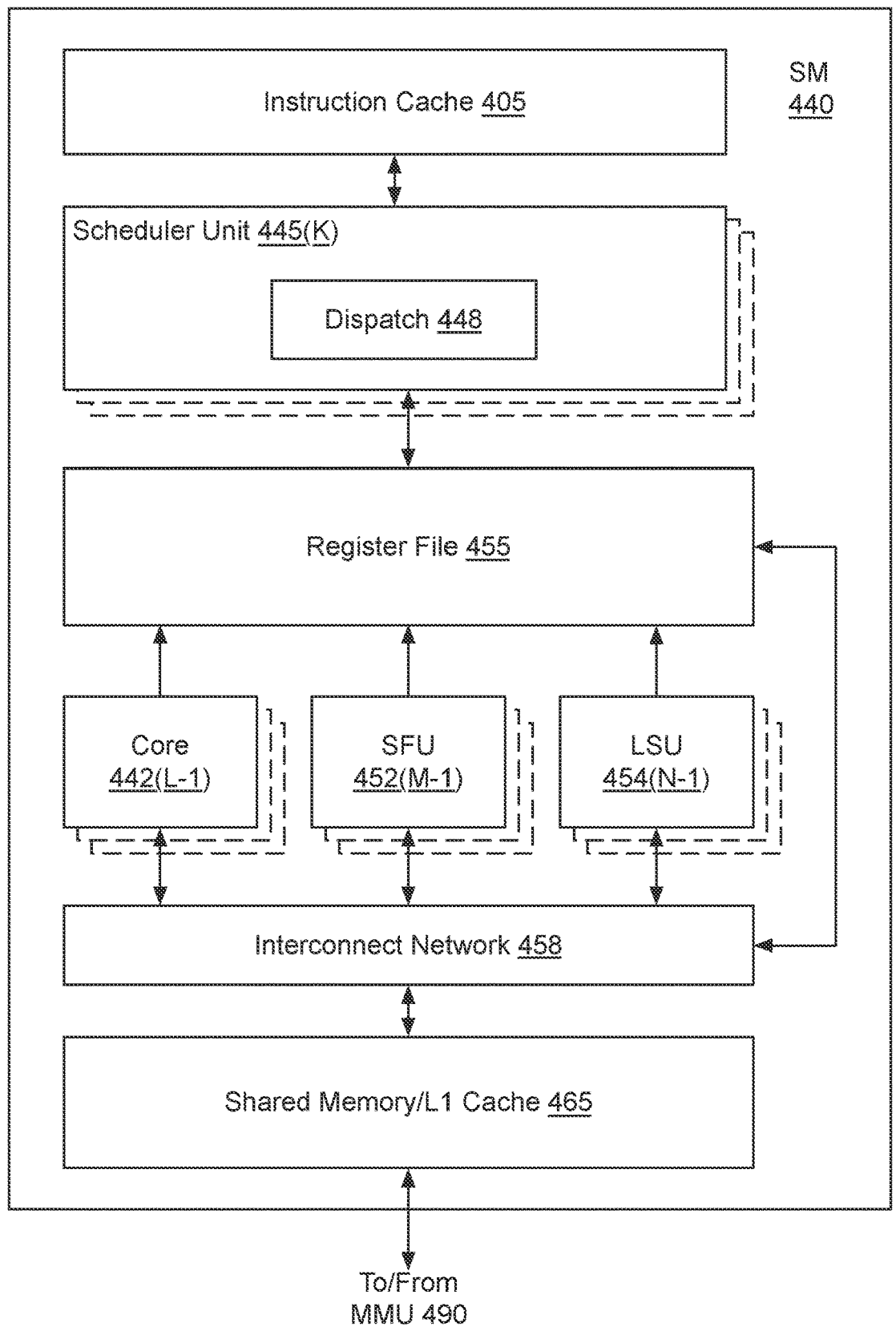
FIG. 4C illustrates an example of the streaming multi-processor of FIG. 4A, suitable for use in implementing some embodiments of the present disclosure.

FIG. 4C illustrates the streaming multi-processor 440 of FIG. 4A, in accordance with an embodiment. As shown in FIG. 4C, the SM 440 includes an instruction cache 405, one or more (K) scheduler units 445, a register file 455, one or more processing cores 442, one or more special function units (SFUs) 452, one or more load/store units (LSUs) 454, an interconnect network 458, a shared memory/L1 cache 465.

As described above, the work distribution unit 325 dispatches tasks for execution on the GPCs 350 of the PPU 300. The tasks are allocated to a particular DPC 420 within a GPC 350 and, if the task is associated with a shader program, the task may be allocated to an SM 440. The scheduler unit 445 receives the tasks from the work distribution unit 325 and manages instruction scheduling for one or more thread blocks assigned to the SM 440. The scheduler unit 445 schedules thread blocks for execution as warps of parallel threads, where each thread block is allocated at least one warp. In an embodiment, each warp executes 32 threads. The scheduler unit 445 may manage a plurality of different thread blocks, allocating the warps to the different thread blocks and then dispatching instructions from the plurality of different cooperative groups to the various functional units (e.g., cores 442, SFUs 452, and LSUs 454) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch unit 448 is configured to transmit instructions to one or more of the functional units. In the embodiment, the scheduler unit 445 includes two dispatch units 448 that enable two different instructions from the same warp to be dispatched during each clock cycle. In alternative embodiments, each scheduler unit 445 may include a single dispatch unit 448 or additional dispatch units 448.

Each SM 440 includes a register file 455 that provides a set of registers for the functional units of the SM 440. In an embodiment, the register file 455 is divided between each of the functional units such that each functional unit is allocated a dedicated portion of the register file 455. In another embodiment, the register file 455 is divided between the different warps being executed by the SM 440. The register file 455 provides temporary storage for operands connected to the data paths of the functional units.

Each SM 440 comprises L processing cores 442. In an embodiment, the SM 440 includes a large number (e.g., 128, etc.) of distinct processing cores 442. Each core 442 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the cores 442 include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the cores 442. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A×B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each SM 440 also comprises M SFUs 452 that perform special functions (e.g., attribute evaluation, reciprocal square root, and the like). In an embodiment, the SFUs 452 may include a tree traversal unit configured to traverse a hierarchical tree data structure. In an embodiment, the SFUs 452 may include texture unit configured to perform texture map filtering operations. In an embodiment, the texture units are configured to load texture maps (e.g., a 2D array of texels) from the memory 304 and sample the texture maps to produce sampled texture values for use in shader programs executed by the SM 440. In an embodiment, the texture maps are stored in the shared memory/L1 cache 465. The texture units implement texture operations such as filtering operations using mip-maps (e.g., texture maps of varying levels of detail). In an embodiment, each SM 340 includes two texture units.

Each SM 440 also comprises N LSUs 454 that implement load and store operations between the shared memory/L1 cache 465 and the register file 455. Each SM 440 includes an interconnect network 458 that connects each of the functional units to the register file 455 and the shared memory/L1 cache 465. In an embodiment, the interconnect network 458 is a crossbar that can be configured to connect any of the functional units to any of the registers in the register file 455 and memory locations in shared memory/L1 cache 465.

The shared memory/L1 cache 465 is an array of on-chip memory that allows for data storage and communication between the SM 440 and the primitive engine 435 and between threads in the SM 440. In an embodiment, the shared memory/L1 cache 465 comprises 128 KB of storage capacity and is in the path from the SM 440 to the memory partition unit 380. The shared memory/L1 cache 465 can be used to cache reads and writes. One or more of the shared memory/L1 cache 465, L2 cache 460, and memory 304 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 465 enables the shared memory/L1 cache 465 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 3, are bypassed, creating a much simpler programming model. In the general purpose parallel computation configuration, the work distribution unit 325 assigns and distributes blocks of threads directly to the DPCs 420. The threads in a block execute the same program, using a unique thread ID in the calculation to ensure each thread generates unique results, using the SM 440 to execute the program and perform calculations, shared memory/L1 cache 465 to communicate between threads, and the LSU 454 to read and write global memory through the shared memory/L1 cache 465 and the memory partition unit 380. When configured for general purpose parallel computation, the SM 440 can also write commands that the scheduler unit 320 can use to launch new work on the DPCs 420.

The PPU 300 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like.

In an embodiment, the PPU 300 is embodied on a single semiconductor substrate. In another embodiment, the PPU 300 is included in a system-on-a-chip (SoC) along with one or more other devices such as additional PPUs 300, the memory 304, a reduced instruction set computer (RISC) CPU, a memory management unit (MMU), a digital-to-analog converter (DAC), and the like.

In an embodiment, the PPU 300 may be included on a graphics card that includes one or more memory devices. The graphics card may be configured to interface with a PCIe slot on a motherboard of a desktop computer. In yet another embodiment, the PPU 300 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

FIG. 5A is a conceptual diagram of a processing system 500 implemented using the PPU 300 of FIG. 3C, in accordance with an embodiment. The exemplary system 500 may be configured to implement the method 335 and/or 360 shown in FIGS. 3A and 3B. The processing system 500 includes a CPU 530, switch 510, and multiple PPUs 300, and respective memories 304.

The PPUs 300 may each include, and/or be configured to perform functions of, one or more processing cores and/or components thereof, such as Tensor Cores (TCs), Tensor Processing Units(TPUs), Pixel Visual Cores (PVCs), Vision Processing Units (VPUs), Graphics Processing Clusters (GPCs), Texture Processing Clusters (TPCs), Streaming Multiprocessors (SMs), Tree Traversal Units (TTUs), Artificial Intelligence Accelerators (AIAs), Deep Learning Accelerators (DLAs), Arithmetic-Logic Units (ALUs), Application-Specific Integrated Circuits (ASICs), Floating Point Units (FPUs), input/output (I/O) elements, peripheral component interconnect (PCI) or peripheral component interconnect express (PCIe) elements, and/or the like.

The NVLink 310 provides high-speed communication links between each of the PPUs 300. Although a particular number of NVLink 310 and interconnect 302 connections are illustrated in FIG. 5A, the number of connections to each PPU 300 and the CPU 530 may vary. The switch 510 interfaces between the interconnect 302 and the CPU 530. The PPUs 300, memories 304, and NVLinks 310 may be situated on a single semiconductor platform to form a parallel processing module 525. In an embodiment, the switch 510 supports two or more protocols to interface between various different connections and/or links.

In another embodiment (not shown), the NVLink 310 provides one or more high-speed communication links between each of the PPUs 300 and the CPU 530 and the switch 510 interfaces between the interconnect 302 and each of the PPUs 300. The PPUs 300, memories 304, and interconnect 302 may be situated on a single semiconductor platform to form a parallel processing module 525. In yet another embodiment (not shown), the interconnect 302 provides one or more communication links between each of the PPUs 300 and the CPU 530 and the switch 510 interfaces between each of the PPUs 300 using the NVLink 310 to provide one or more high-speed communication links between the PPUs 300. In another embodiment (not shown), the NVLink 310 provides one or more high-speed communication links between the PPUs 300 and the CPU 530 through the switch 510. In yet another embodiment (not shown), the interconnect 302 provides one or more communication links between each of the PPUs 300 directly. One or more of the NVLink 310 high-speed communication links may be implemented as a physical NVLink interconnect or either an on-chip or on-die interconnect using the same protocol as the NVLink 310.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 525 may be implemented as a circuit board substrate and each of the PPUs 300 and/or memories 304 may be packaged devices. In an embodiment, the CPU 530, switch 510, and the parallel processing module 525 are situated on a single semiconductor platform.

In an embodiment, the signaling rate of each NVLink 310 is 20 to 25 Gigabits/second and each PPU 300 includes six NVLink 310 interfaces (as shown in FIG. 5A, five NVLink 310 interfaces are included for each PPU 300). Each NVLink 310 provides a data transfer rate of 25 Gigabytes/second in each direction, with six links providing 300 Gigabytes/second. The NVLinks 310 can be used exclusively for PPU-to-PPU communication as shown in FIG. 5A, or some combination of PPU-to-PPU and PPU-to-CPU, when the CPU 530 also includes one or more NVLink 310 interfaces.

In an embodiment, the NVLink 310 allows direct load/store/atomic access from the CPU 530 to each PPU's 300 memory 304. In an embodiment, the NVLink 310 supports coherency operations, allowing data read from the memories 304 to be stored in the cache hierarchy of the CPU 530, reducing cache access latency for the CPU 530. In an embodiment, the NVLink 310 includes support for Address Translation Services (ATS), allowing the PPU 300 to directly access page tables within the CPU 530. One or more of the NVLinks 310 may also be configured to operate in a low-power mode.

FIG. 5B illustrates an exemplary system 565 in which the various architecture and/or functionality of the various previous embodiments may be implemented. The exemplary system 565 may be configured to implement the method 335 and/or 360 shown in FIGS. 3A and 3B.

As shown, a system 565 is provided including at least one central processing unit 530 that is connected to a communication bus 575. The communication bus 575 may directly or indirectly couple one or more of the following devices: main memory 540, network interface 535, CPU(s) 530, display device(s) 545, input device(s) 560, switch 510, and parallel processing system 525. The communication bus 575 may be implemented using any suitable protocol and may represent one or more links or busses, such as an address bus, a data bus, a control bus, or a combination thereof. The communication bus 575 may include one or more bus or link types, such as an industry standard architecture (ISA) bus, an extended industry standard architecture (EISA) bus, a video electronics standards association (VESA) bus, a peripheral component interconnect (PCI) bus, a peripheral component interconnect express (PCIe) bus, HyperTransport, and/or another type of bus or link. In some embodiments, there are direct connections between components. As an example, the CPU(s) 530 may be directly connected to the main memory 540. Further, the CPU(s) 530 may be directly connected to the parallel processing system 525. Where there is direct, or point-to-point connection between components, the communication bus 575 may include a PCIe link to carry out the connection. In these examples, a PCI bus need not be included in the system 565.

Although the various blocks of FIG. 5B are shown as connected via the communication bus 575 with lines, this is not intended to be limiting and is for clarity only. For example, in some embodiments, a presentation component, such as display device(s) 545, may be considered an I/O component, such as input device(s) 560 (e.g., if the display is a touch screen). As another example, the CPU(s) 530 and/or parallel processing system 525 may include memory (e.g., the main memory 540 may be representative of a storage device in addition to the parallel processing system 525, the CPUs 530, and/or other components). In other words, the computing device of FIG. 5B is merely illustrative. Distinction is not made between such categories as "workstation," "server," "laptop," "desktop," "tablet," "client device," "mobile device," "hand-held device," "game console," "electronic control unit (ECU)," "virtual reality system," and/or other device or system types, as all are contemplated within the scope of the computing device of FIG. 5B.

The system 565 also includes a main memory 540. Control logic (software) and data are stored in the main memory 540 which may take the form of a variety of computer-readable media. The computer-readable media may be any available media that may be accessed by the system 565. The computer-readable media may include both volatile and nonvolatile media, and removable and non-removable media. By way of example, and not limitation, the computer-readable media may comprise computer-storage media and communication media.

The computer-storage media may include both volatile and nonvolatile media and/or removable and non-removable media implemented in any method or technology for storage of information such as computer-readable instructions, data structures, program modules, and/or other data types. For example, the main memory 540 may store computer-readable instructions (e.g., that represent a program(s) and/or a program element(s), such as an operating system. Computer-storage media may include, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may be accessed by system 565. As used herein, computer storage media does not comprise signals per se.

The computer storage media may embody computer-readable instructions, data structures, program modules, and/or other data types in a modulated data signal such as a carrier wave or other transport mechanism and includes any information delivery media. The term "modulated data signal" may refer to a signal that has one or more of its characteristics set or changed in such a manner as to encode information in the signal. By way of example, and not limitation, the computer storage media may include wired media such as a wired network or direct-wired connection, and wireless media such as acoustic, RF, infrared and other wireless media. Combinations of any of the above should also be included within the scope of computer-readable media.

Computer programs, when executed, enable the system 565 to perform various functions. The CPU(s) 530 may be configured to execute at least some of the computer-readable instructions to control one or more components of the system 565 to perform one or more of the methods and/or processes described herein. The CPU(s) 530 may each include one or more cores (e.g., one, two, four, eight, twenty-eight, seventy-two, etc.) that are capable of handling a multitude of software threads simultaneously. The CPU(s) 530 may include any type of processor, and may include different types of processors depending on the type of system 565 implemented (e.g., processors with fewer cores for mobile devices and processors with more cores for servers). For example, depending on the type of system 565, the processor may be an Advanced RISC Machines (ARM) processor implemented using Reduced Instruction Set Computing (RISC) or an x86 processor implemented using Complex Instruction Set Computing (CISC). The system 565 may include one or more CPUs 530 in addition to one or more microprocessors or supplementary co-processors, such as math co-processors.

In addition to or alternatively from the CPU(s) 530, the parallel processing module 525 may be configured to execute at least some of the computer-readable instructions to control one or more components of the system 565 to perform one or more of the methods and/or processes described herein. The parallel processing module 525 may be used by the system 565 to render graphics (e.g., 3D graphics) or perform general purpose computations. For example, the parallel processing module 525 may be used for General-Purpose computing on GPUs (GPGPU). In embodiments, the CPU(s) 530 and/or the parallel processing module 525 may discretely or jointly perform any combination of the methods, processes and/or portions thereof.

The system 565 also includes input device(s) 560, the parallel processing system 525, and display device(s) 545. The display device(s) 545 may include a display (e.g., a monitor, a touch screen, a television screen, a heads-up-display (HUD), other display types, or a combination thereof), speakers, and/or other presentation components. The display device(s) 545 may receive data from other components (e.g., the parallel processing system 525, the CPU(s) 530, etc.), and output the data (e.g., as an image, video, sound, etc.).

The network interface 535 may enable the system 565 to be logically coupled to other devices including the input devices 560, the display device(s) 545, and/or other components, some of which may be built in to (e.g., integrated in) the system 565. Illustrative input devices 560 include a microphone, mouse, keyboard, joystick, game pad, game controller, satellite dish, scanner, printer, wireless device, etc. The input devices 560 may provide a natural user interface (NUI) that processes air gestures, voice, or other physiological inputs generated by a user. In some instances, inputs may be transmitted to an appropriate network element for further processing. An NUI may implement any combination of speech recognition, stylus recognition, facial recognition, biometric recognition, gesture recognition both on screen and adjacent to the screen, air gestures, head and eye tracking, and touch recognition (as described in more detail below) associated with a display of the system 565. The system 565 may be include depth cameras, such as stereoscopic camera systems, infrared camera systems, RGB camera systems, touchscreen technology, and combinations of these, for gesture detection and recognition. Additionally, the system 565 may include accelerometers or gyroscopes (e.g., as part of an inertia measurement unit (IMU)) that enable detection of motion. In some examples, the output of the accelerometers or gyroscopes may be used by the system 565 to render immersive augmented reality or virtual reality.

Further, the system 565 may be coupled to a network (e.g., a telecommunications network, local area network (LAN), wireless network, wide area network (WAN) such as the Internet, peer-to-peer network, cable network, or the like) through a network interface 535 for communication purposes. The system 565 may be included within a distributed network and/or cloud computing environment.

The network interface 535 may include one or more receivers, transmitters, and/or transceivers that enable the system 565 to communicate with other computing devices via an electronic communication network, included wired and/or wireless communications. The network interface 535 may be implemented as a network interface controller (NIC) that includes one or more data processing units (DPUs) to perform operations such as (for example and without limitation) packet parsing and accelerating network processing and communication. The network interface 535 may include components and functionality to enable communication over any of a number of different networks, such as wireless networks (e.g., Wi-Fi, Z-Wave, Bluetooth, Bluetooth LE, ZigBee, etc.), wired networks (e.g., communicating over Ethernet or InfiniBand), low-power wide-area networks (e.g., LoRaWAN, SigFox, etc.), and/or the Internet.

The system 565 may also include a secondary storage (not shown). The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. The system 565 may also include a hard-wired power supply, a battery power supply, or a combination thereof (not shown). The power supply may provide power to the system 565 to enable the components of the system 565 to operate.

Each of the foregoing modules and/or devices may even be situated on a single semiconductor platform to form the system 565. Alternately, the various modules may also be situated separately or in various combinations of semiconductor platforms per the desires of the user. While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Example Network Environments

Network environments suitable for use in implementing embodiments of the disclosure may include one or more client devices, servers, network attached storage (NAS), other backend devices, and/or other device types. The client devices, servers, and/or other device types (e.g., each device) may be implemented on one or more instances of the processing system 500 of FIG. 5A and/or exemplary system 565 of FIG. 5B—e.g., each device may include similar components, features, and/or functionality of the processing system 500 and/or exemplary system 565.

Components of a network environment may communicate with each other via a network(s), which may be wired, wireless, or both. The network may include multiple networks, or a network of networks. By way of example, the network may include one or more Wide Area Networks (WANs), one or more Local Area Networks (LANs), one or more public networks such as the Internet and/or a public switched telephone network (PSTN), and/or one or more private networks. Where the network includes a wireless telecommunications network, components such as a base station, a communications tower, or even access points (as well as other components) may provide wireless connectivity.

Compatible network environments may include one or more peer-to-peer network environments—in which case a server may not be included in a network environment—and one or more client-server network environments—in which case one or more servers may be included in a network environment. In peer-to-peer network environments, functionality described herein with respect to a server(s) may be implemented on any number of client devices.

In at least one embodiment, a network environment may include one or more cloud-based network environments, a distributed computing environment, a combination thereof, etc. A cloud-based network environment may include a framework layer, a job scheduler, a resource manager, and a distributed file system implemented on one or more of servers, which may include one or more core network servers and/or edge servers. A framework layer may include a framework to support software of a software layer and/or one or more application(s) of an application layer. The software or application(s) may respectively include web-based service software or applications. In embodiments, one or more of the client devices may use the web-based service software or applications (e.g., by accessing the service software and/or applications via one or more application programming interfaces (APIs)). The framework layer may be, but is not limited to, a type of free and open-source software web application framework such as that may use a distributed file system for large-scale data processing (e.g., "big data").

A cloud-based network environment may provide cloud computing and/or cloud storage that carries out any combination of computing and/or data storage functions described herein (or one or more portions thereof). Any of these various functions may be distributed over multiple locations from central or core servers (e.g., of one or more data centers that may be distributed across a state, a region, a country, the globe, etc.). If a connection to a user (e.g., a client device) is relatively close to an edge server(s), a core server(s) may designate at least a portion of the functionality to the edge server(s). A cloud-based network environment may be private (e.g., limited to a single organization), may be public (e.g., available to many organizations), and/or a combination thereof (e.g., a hybrid cloud environment).

The client device(s) may include at least some of the components, features, and functionality of the example processing system 500 of FIG. 5A and/or exemplary system 565 of FIG. 5B. By way of example and not limitation, a client device may be embodied as a Personal Computer (PC), a laptop computer, a mobile device, a smartphone, a tablet computer, a smart watch, a wearable computer, a Personal Digital Assistant (PDA), an MP3 player, a virtual reality headset, a Global Positioning System (GPS) or device, a video player, a video camera, a surveillance device or system, a vehicle, a boat, a flying vessel, a virtual machine, a drone, a robot, a handheld communications device, a hospital device, a gaming device or system, an entertainment system, a vehicle computer system, an embedded system controller, a remote control, an appliance, a consumer electronic device, a workstation, an edge device, any combination of these delineated devices, or any other suitable device.

Machine Learning

Deep neural networks (DNNs) developed on processors, such as the PPU 300 have been used for diverse use cases, from self-driving cars to faster drug development, from automatic image captioning in online image databases to smart real-time language translation in video chat applications. Deep learning is a technique that models the neural learning process of the human brain, continually learning, continually getting smarter, and delivering more accurate results more quickly over time. A child is initially taught by an adult to correctly identify and classify various shapes, eventually being able to identify shapes without any coaching. Similarly, a deep learning or neural learning system needs to be trained in object recognition and classification for it get smarter and more efficient at identifying basic objects, occluded objects, etc., while also assigning context to objects.

At the simplest level, neurons in the human brain look at various inputs that are received, importance levels are assigned to each of these inputs, and output is passed on to other neurons to act upon. An artificial neuron is the most basic model of a neural network. In one example, a neuron may receive one or more inputs that represent various features of an object that the neuron is being trained to recognize and classify, and each of these features is assigned a certain weight based on the importance of that feature in defining the shape of an object.

A deep neural network (DNN) model includes multiple layers of many connected nodes (e.g., neurons, Boltzmann machines, radial basis functions, convolutional layers, etc.) that can be trained with enormous amounts of input data to quickly solve complex problems with high accuracy. In one example, a first layer of the DNN model breaks down an input image of an automobile into various sections and looks for basic patterns such as lines and angles. The second layer assembles the lines to look for higher level patterns such as wheels, windshields, and mirrors. The next layer identifies the type of vehicle, and the final few layers generate a label for the input image, identifying the model of a specific automobile brand.

Once the DNN is trained, the DNN can be deployed and used to identify and classify objects or patterns in a process known as inference. Examples of inference (the process through which a DNN extracts useful information from a given input) include identifying handwritten numbers on checks deposited into ATM machines, identifying images of friends in photos, delivering movie recommendations to over fifty million users, identifying and classifying different types of automobiles, pedestrians, and road hazards in driverless cars, or translating human speech in real-time.

During training, data flows through the DNN in a forward propagation phase until a prediction is produced that indicates a label corresponding to the input. If the neural network does not correctly label the input, then errors between the correct label and the predicted label are analyzed, and the weights are adjusted for each feature during a backward propagation phase until the DNN correctly labels the input and other inputs in a training dataset. Training complex neural networks requires massive amounts of parallel computing performance, including floating-point multiplications and additions that are supported by the PPU 400. Inferencing is less compute-intensive than training, being a latency-sensitive process where a trained neural network is applied to new inputs it has not seen before to classify images, detect emotions, identify recommendations, recognize and translate speech, and generally infer new information.

Neural networks rely heavily on matrix math operations, and complex multi-layered networks require tremendous amounts of floating-point performance and bandwidth for both efficiency and speed. With thousands of processing cores, optimized for matrix math operations, and delivering tens to hundreds of TFLOPS of performance, the PPU 400 is a computing platform capable of delivering performance required for deep neural network-based artificial intelligence and machine learning applications.

Furthermore, images generated applying one or more of the techniques disclosed herein may be used to train, test, or certify DNNs used to recognize objects and environments in the real world. Such images may include scenes of roadways, factories, buildings, urban settings, rural settings, humans, animals, and any other physical object or real-world setting. Such images may be used to train, test, or certify DNNs that are employed in machines or robots to manipulate, handle, or modify physical objects in the real world. Furthermore, such images may be used to train, test, or certify DNNs that are employed in autonomous vehicles to navigate and move the vehicles through the real world. Additionally, images generated applying one or more of the techniques disclosed herein may be used to convey information to users of such machines, robots, and vehicles.

Figure 5C:
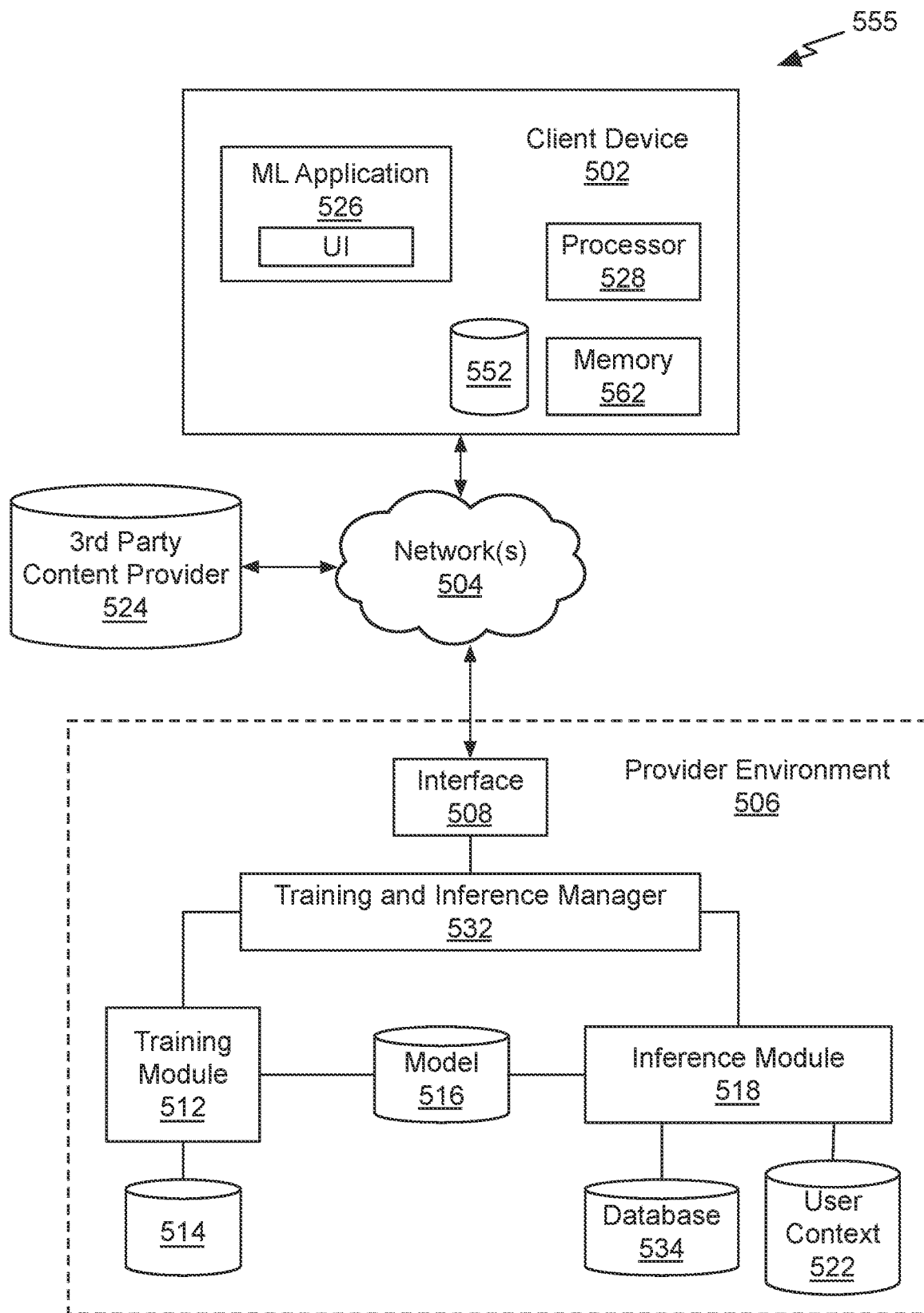
FIG. 5C illustrates components of an exemplary system that can be used to train and utilize machine learning, in at least one embodiment.

FIG. 5C illustrates components of an exemplary system 555 that can be used to train and utilize machine learning, in accordance with at least one embodiment. As will be discussed, various components can be provided by various combinations of computing devices and resources, or a single computing system, which may be under control of a single entity or multiple entities. Further, aspects may be triggered, initiated, or requested by different entities. In at least one embodiment training of a neural network might be instructed by a provider associated with provider environment 506, while in at least one embodiment training might be requested by a customer or other user having access to a provider environment through a client device 502 or other such resource. In at least one embodiment, training data (or data to be analyzed by a trained neural network) can be provided by a provider, a user, or a third party content provider 524. In at least one embodiment, client device 502 may be a vehicle or object that is to be navigated on behalf of a user, for example, which can submit requests and/or receive instructions that assist in navigation of a device.

In at least one embodiment, requests are able to be submitted across at least one network 504 to be received by a provider environment 506. In at least one embodiment, a client device may be any appropriate electronic and/or computing devices enabling a user to generate and send such requests, such as, but not limited to, desktop computers, notebook computers, computer servers, smartphones, tablet computers, gaming consoles (portable or otherwise), computer processors, computing logic, and set-top boxes. Network(s) 504 can include any appropriate network for transmitting a request or other such data, as may include Internet, an intranet, an Ethernet, a cellular network, a local area network (LAN), a wide area network (WAN), a personal area network (PAN), an ad hoc network of direct wireless connections among peers, and so on.

In at least one embodiment, requests can be received at an interface layer 508, which can forward data to a training and inference manager 532, in this example. The training and inference manager 532 can be a system or service including hardware and software for managing requests and service corresponding data or content, in at least one embodiment, the training and inference manager 532 can receive a request to train a neural network, and can provide data for a request to a training module 512. In at least one embodiment, training module 512 can select an appropriate model or neural network to be used, if not specified by the request, and can train a model using relevant training data. In at least one embodiment, training data can be a batch of data stored in a training data repository 514, received from client device 502, or obtained from a third party provider 524. In at least one embodiment, training module 512 can be responsible for training data. A neural network can be any appropriate network, such as a recurrent neural network (RNN) or convolutional neural network (CNN). Once a neural network is trained and successfully evaluated, a trained neural network can be stored in a model repository 516, for example, that may store different models or networks for users, applications, or services, etc. In at least one embodiment, there may be multiple models for a single application or entity, as may be utilized based on a number of different factors.

In at least one embodiment, at a subsequent point in time, a request may be received from client device 502 (or another such device) for content (e.g., path determinations) or data that is at least partially determined or impacted by a trained neural network. This request can include, for example, input data to be processed using a neural network to obtain one or more inferences or other output values, classifications, or predictions, or for at least one embodiment, input data can be received by interface layer 508 and directed to inference module 518, although a different system or service can be used as well. In at least one embodiment, inference module 518 can obtain an appropriate trained network, such as a trained deep neural network (DNN) as discussed herein, from model repository 516 if not already stored locally to inference module 518. Inference module 518 can provide data as input to a trained network, which can then generate one or more inferences as output. This may include, for example, a classification of an instance of input data. In at least one embodiment, inferences can then be transmitted to client device 502 for display or other communication to a user. In at least one embodiment, context data for a user may also be stored to a user context data repository 522, which may include data about a user which may be useful as input to a network in generating inferences, or determining data to return to a user after obtaining instances. In at least one embodiment, relevant data, which may include at least some of input or inference data, may also be stored to a local database 534 for processing future requests. In at least one embodiment, a user can use account information or other information to access resources or functionality of a provider environment. In at least one embodiment, if permitted and available, user data may also be collected and used to further train models, in order to provide more accurate inferences for future requests. In at least one embodiment, requests may be received through a user interface to a machine learning application 526 executing on client device 502, and results displayed through a same interface. A client device can include resources such as a processor 528 and memory 562 for generating a request and processing results or a response, as well as at least one data storage element 552 for storing data for machine learning application 526.

In at least one embodiment a processor 528 (or a processor of training module 512 or inference module 518) will be a central processing unit (CPU). As mentioned, however, resources in such environments can utilize GPUs to process data for at least certain types of requests. With thousands of cores, GPUs, such as PPU 400 are designed to handle substantial parallel workloads and, therefore, have become popular in deep learning for training neural networks and generating predictions. While use of GPUs for offline builds has enabled faster training of larger and more complex models, generating predictions offline implies that either request-time input features cannot be used or predictions must be generated for all permutations of features and stored in a lookup table to serve real-time requests. If a deep learning framework supports a CPU-mode and a model is small and simple enough to perform a feed-forward on a CPU with a reasonable latency, then a service on a CPU instance could host a model. In this case, training can be done offline on a GPU and inference done in real-time on a CPU. If a CPU approach is not viable, then a service can run on a GPU instance. Because GPUs have different performance and cost characteristics than CPUs, however, running a service that offloads a runtime algorithm to a GPU can require it to be designed differently from a CPU based service.

In at least one embodiment, video data can be provided from client device 502 for enhancement in provider environment 506. In at least one embodiment, video data can be processed for enhancement on client device 502. In at least one embodiment, video data may be streamed from a third party content provider 524 and enhanced by third party content provider 524, provider environment 506, or client device 502. In at least one embodiment, video data can be provided from client device 502 for use as training data in provider environment 506.

In at least one embodiment, supervised and/or unsupervised training can be performed by the client device 502 and/or the provider environment 506. In at least one embodiment, a set of training data 514 (e.g., classified or labeled data) is provided as input to function as training data. In at least one embodiment, training data can include instances of at least one type of object for which a neural network is to be trained, as well as information that identifies that type of object. In at least one embodiment, training data might include a set of images that each includes a representation of a type of object, where each image also includes, or is associated with, a label, metadata, classification, or other piece of information identifying a type of object represented in a respective image. Various other types of data may be used as training data as well, as may include text data, audio data, video data, and so on. In at least one embodiment, training data 514 is provided as training input to a training module 512. In at least one embodiment, training module 512 can be a system or service that includes hardware and software, such as one or more computing devices executing a training application, for training a neural network (or other model or algorithm, etc.). In at least one embodiment, training module 512 receives an instruction or request indicating a type of model to be used for training, in at least one embodiment, a model can be any appropriate statistical model, network, or algorithm useful for such purposes, as may include an artificial neural network, deep learning algorithm, learning classifier, Bayesian network, and so on. In at least one embodiment, training module 512 can select an initial model, or other untrained model, from an appropriate repository 516 and utilize training data 514 to train a model, thereby generating a trained model (e.g., trained deep neural network) that can be used to classify similar types of data, or generate other such inferences. In at least one embodiment where training data is not used, an appropriate initial model can still be selected for training on input data per training module 512.

In at least one embodiment, a model can be trained in a number of different ways, as may depend in part upon a type of model selected. In at least one embodiment, a machine learning algorithm can be provided with a set of training data, where a model is a model artifact created by a training process. In at least one embodiment, each instance of training data contains a correct answer (e.g., classification), which can be referred to as a target or target attribute. In at least one embodiment, a learning algorithm finds patterns in training data that map input data attributes to a target, an answer to be predicted, and a machine learning model is output that captures these patterns. In at least one embodiment, a machine learning model can then be used to obtain predictions on new data for which a target is not specified.

In at least one embodiment, training and inference manager 532 can select from a set of machine learning models including binary classification, multiclass classification, generative, and regression models. In at least one embodiment, a type of model to be used can depend at least in part upon a type of target to be predicted.

Graphics Processing

In an embodiment, the PPU 400 comprises a graphics processing unit (GPU). The PPU 400 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The PPU 400 can be configured to process the graphics primitives to generate a frame buffer (e.g., pixel data for each of the pixels of the display).

An application writes model data for a scene (e.g., a collection of vertices and attributes) to a memory such as a system memory or memory 404. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the processing units within the PPU 400 including one or more of a vertex shader, hull shader, domain shader, geometry shader, and a pixel shader. For example, one or more of the processing units may be configured to execute a vertex shader program that processes a number of vertices defined by the model data. In an embodiment, the different processing units may be configured to execute different shader programs concurrently. For example, a first subset of processing units may be configured to execute a vertex shader program while a second subset of processing units may be configured to execute a pixel shader program. The first subset of processing units processes vertex data to produce processed vertex data and writes the processed vertex data to the L2 cache 460 and/or the memory 404. After the processed vertex data is rasterized (e.g., transformed from three-dimensional data into two-dimensional data in screen space) to produce fragment data, the second subset of processing units executes a pixel shader to produce processed fragment data, which is then blended with other processed fragment data and written to the frame buffer in memory 404. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

A graphics processing pipeline may be implemented via an application executed by a host processor, such as a CPU. In an embodiment, a device driver may implement an application programming interface (API) that defines various functions that can be utilized by an application in order to generate graphical data for display. The device driver is a software program that includes a plurality of instructions that control the operation of the PPU 400. The API provides an abstraction for a programmer that lets a programmer utilize specialized graphics hardware, such as the PPU 400, to generate the graphical data without requiring the programmer to utilize the specific instruction set for the PPU 400. The application may include an API call that is routed to the device driver for the PPU 400. The device driver interprets the API call and performs various operations to respond to the API call. In some instances, the device driver may perform operations by executing instructions on the CPU. In other instances, the device driver may perform operations, at least in part, by launching operations on the PPU 400 utilizing an input/output interface between the CPU and the PPU 400. In an embodiment, the device driver is configured to implement the graphics processing pipeline utilizing the hardware of the PPU 400.

Images generated applying one or more of the techniques disclosed herein may be displayed on a monitor or other display device. In some embodiments, the display device may be coupled directly to the system or processor generating or rendering the images. In other embodiments, the display device may be coupled indirectly to the system or processor such as via a network. Examples of such networks include the Internet, mobile telecommunications networks, a WIFI network, as well as any other wired and/or wireless networking system. When the display device is indirectly coupled, the images generated by the system or processor may be streamed over the network to the display device. Such streaming allows, for example, video games or other applications, which render images, to be executed on a server, a data center, or in a cloud-based computing environment and the rendered images to be transmitted and displayed on one or more user devices (such as a computer, video game console, smartphone, other mobile device, etc.) that are physically separate from the server or data center. Hence, the techniques disclosed herein can be applied to enhance the images that are streamed and to enhance services that stream images such as NVIDIA GeForce Now (GFN), Google Stadia, and the like.

Example Streaming System

Figure 6:
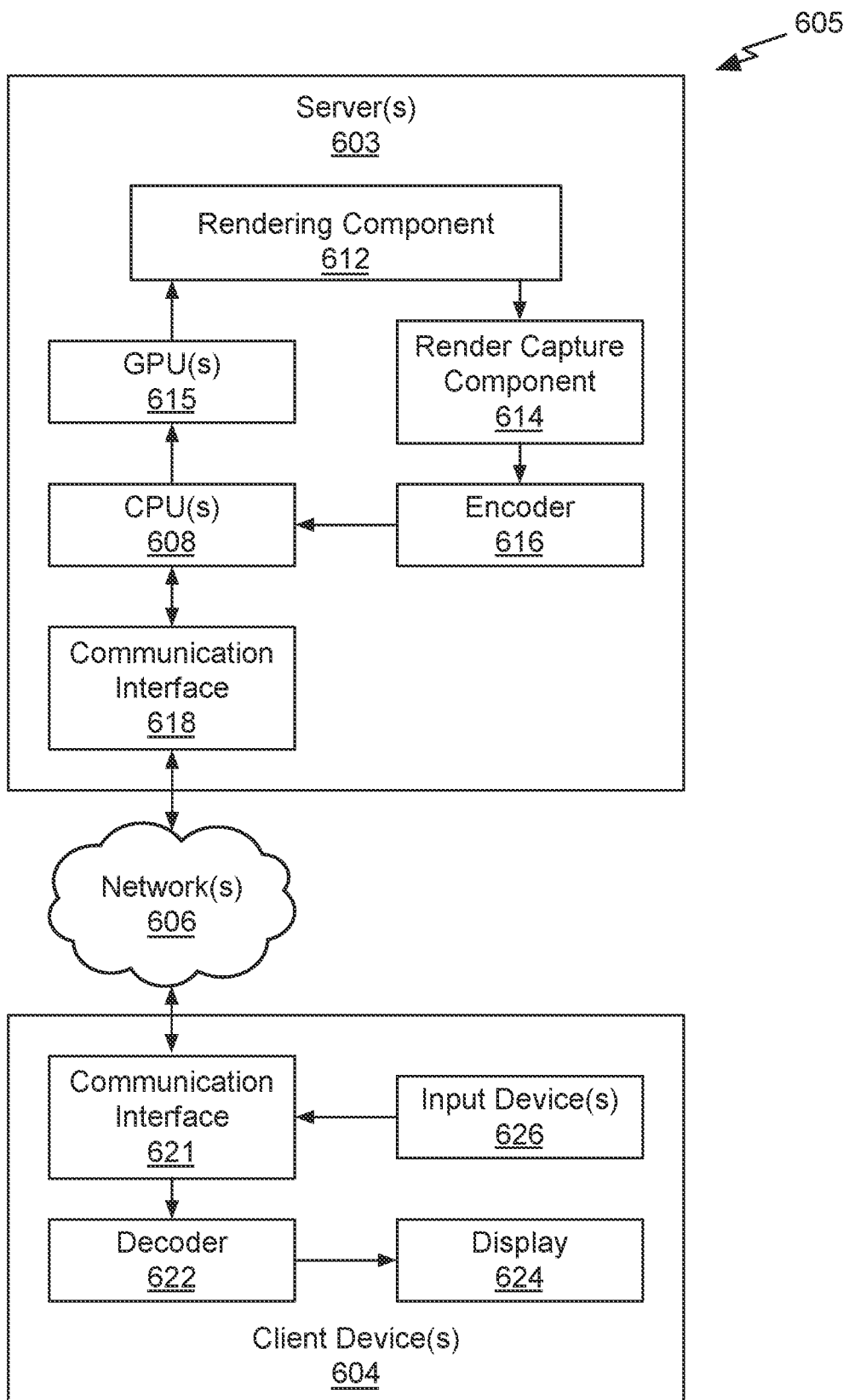
FIG. 6 illustrates an exemplary streaming system suitable for use in implementing some embodiments of the present disclosure.

FIG. 6B is an example system diagram for a streaming system 605, in accordance with some embodiments of the present disclosure. FIG. 6B includes server(s) 603 (which may include similar components, features, and/or functionality to the example processing system 500 of FIG. 5A and/or exemplary system 565 of FIG. 5B), client device(s) 604 (which may include similar components, features, and/ or functionality to the example processing system 500 of FIG. 5A and/or exemplary system 565 of FIG. 5B), and network(s) 606 (which may be similar to the network(s) described herein). In some embodiments of the present disclosure, the system 605 may be implemented.

In an embodiment, the streaming system 605 is a game streaming system and the server(s) 603 are game server(s). In the system 605, for a game session, the client device(s) 604 may only receive input data in response to inputs to the input device(s) 626, transmit the input data to the server(s) 603, receive encoded display data from the server(s) 603, and display the display data on the display 624. As such, the more computationally intense computing and processing is offloaded to the server(s) 603 (e.g., rendering—in particular ray or path tracing—for graphical output of the game session is executed by the GPU(s) 615 of the server(s) 603). In other words, the game session is streamed to the client device(s) 604 from the server(s) 603, thereby reducing the requirements of the client device(s) 604 for graphics processing and rendering.

For example, with respect to an instantiation of a game session, a client device 604 may be displaying a frame of the game session on the display 624 based on receiving the display data from the server(s) 603. The client device 604 may receive an input to one of the input device(s) 626 and generate input data in response. The client device 604 may transmit the input data to the server(s) 603 via the communication interface 621 and over the network(s) 606 (e.g., the Internet), and the server(s) 603 may receive the input data via the communication interface 618. The CPU(s) 608 may receive the input data, process the input data, and transmit data to the GPU(s) 615 that causes the GPU(s) 615 to generate a rendering of the game session. For example, the input data may be representative of a movement of a character of the user in a game, firing a weapon, reloading, passing a ball, turning a vehicle, etc. The rendering component 612 may render the game session (e.g., representative of the result of the input data) and the render capture component 614 may capture the rendering of the game session as display data (e.g., as image data capturing the rendered frame of the game session). The rendering of the game session may include ray or path-traced lighting and/or shadow effects, computed using one or more parallel processing units—such as GPUs, which may further employ the use of one or more dedicated hardware accelerators or processing cores to perform ray or path-tracing techniques—of the server(s) 603. The encoder 616 may then encode the display data to generate encoded display data and the encoded display data may be transmitted to the client device 604 over the network(s) 606 via the communication interface 618. The client device 604 may receive the encoded display data via the communication interface 621 and the decoder 622 may decode the encoded display data to generate the display data. The client device 604 may then display the display data via the display 624.

It is noted that the techniques described herein may be embodied in executable instructions stored in a computer readable medium for use by or in connection with a processor-based instruction execution machine, system, apparatus, or device. It will be appreciated by those skilled in the art that, for some embodiments, various types of computer-readable media can be included for storing data. As used herein, a "computer-readable medium" includes one or more of any suitable media for storing the executable instructions of a computer program such that the instruction execution machine, system, apparatus, or device may read (or fetch) the instructions from the computer-readable medium and execute the instructions for carrying out the described embodiments. Suitable storage formats include one or more of an electronic, magnetic, optical, and electromagnetic format. A non-exhaustive list of conventional exemplary computer-readable medium includes: a portable computer diskette; a random-access memory (RAM); a read-only memory (ROM); an erasable programmable read only memory (EPROM); a flash memory device; and optical storage devices, including a portable compact disc (CD), a portable digital video disc (DVD), and the like.

It should be understood that the arrangement of components illustrated in the attached Figures are for illustrative purposes and that other arrangements are possible. For example, one or more of the elements described herein may be realized, in whole or in part, as an electronic hardware component. Other elements may be implemented in software, hardware, or a combination of software and hardware. Moreover, some or all of these other elements may be combined, some may be omitted altogether, and additional components may be added while still achieving the functionality described herein. Thus, the subject matter described herein may be embodied in many different variations, and all such variations are contemplated to be within the scope of the claims.

To facilitate an understanding of the subject matter described herein, many aspects are described in terms of sequences of actions. It will be recognized by those skilled in the art that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

What is claimed is:

1. A computer-implemented method of executing an application program by a stacked memory system, comprising:

partitioning an N-dimensional array processed by an operation specified by the application program into a first number of N-dimensional sub-arrays;

instantiating portions of the application program that include the operation to produce a second number of program tiles, wherein each program tile comprises instructions for a sub-loop of the operation;

storing a portion of data associated with each sub-array in a local memory block comprising a memory tile of memory tiles, wherein the memory tiles are fabricated within a memory die that is stacked with a processor die within which a two-dimensional (2D) array of processing tiles are fabricated and conductive paths couple each processing tile in the 2D array to a corresponding one of the memory tiles for communication between each processing tile and the corresponding memory tile;

executing the second number of the program tiles by the processing tiles to compute results for the operation, wherein a tile communication network for transmitting memory access requests from each processing tile to memory tiles coupled to a different processing tile is fabricated in the processor die and connects each processing tile in the 2D array with adjacent processing tiles in a first dimension of the 2D array and with adjacent processing tiles in a second dimension of the 2D array.

2. The computer-implemented method of claim 1, wherein N=2, the array is M×P, the first number is X and equals a quantity of the processing tiles, and each 2-dimensional sub-array is M/X×P/X.

3. The computer-implemented method of claim 2, wherein the second number of the program tiles is $X^2$.

4. The computer-implemented method of claim 1, wherein at least one additional memory die is stacked on the memory die and the local memory block for each processing tile comprises the memory tile and additional memory tiles fabricated within the additional memory die that are coupled to the processing tile by the conductive paths.

5. The computer-implemented method of claim 1, wherein the tile communication network transmits data between the first processing tile of the processing tiles and the second memory tile of the memory tiles corresponding to a second processing tile of the processing tiles.

6. The computer-implemented method of claim 1, further comprising:
determining that data is not stored in a first memory tile of the memory tiles that is coupled to a first processing tile of the processing tiles and is stored in a second memory tile coupled to a second processing tile of the processing tiles; and
migrating a thread including at least one of the instructions executing on the first processing tile to the second processing tile for processing of the data.

7. The computer-implemented method of claim 6, wherein migrating the thread comprises:
transmitting a message with thread state for the thread to the second processing tile; and
activating a new thread by the second processing tile in response to receiving the message.

8. The computer-implemented method of claim 6, wherein a thread remote procedure call migrates one or more parameters comprising state for the thread from the first processing tile to the second processing tile.

9. The computer-implemented method of claim 1, wherein the communication network transmits data between a first processing tile of the processing tiles and a second memory die that is stacked on a second processor die.

10. The computer-implemented method of claim 9, further comprising migrating a thread including at least one of the instructions executing on the first processing tile to a second processing tile fabricated within the second processor die for processing of data stored in a second memory tile fabricated within the second memory die.

11. The computer-implemented method of claim 1, further comprising determining the portion of data associated with each program tile using a graph partitioner.

12. The computer-implemented method of claim 1, wherein each processing tile comprises a mapping circuit configured to translate an address generated by the processing tile to a location in the local memory block or the local memory block of a different processing tile within the processor die.

13. The computer-implemented method of claim 1, wherein each processing tile comprises a mapping circuit configured to translate an address generated by the processing tile to a location in the local memory block, the local memory block of a different processing tile within the processor die, an additional memory die that is stacked on an additional processor within a device that includes the processor die and the memory die, or an additional memory die that is stacked on an additional processor that is external to the device.

14. The computer-implemented method of claim 1, wherein the conductive paths comprise a through-die via structure that is fabricated within the memory die.

15. The computer-implemented method of claim 14, wherein the through-die via structure comprises at least one of through-silicon vias, solder bumps, or hybrid bonds.

16. The computer-implemented method of claim 1, wherein the processor die comprises a graphics processing unit.

17. The computer-implemented method of claim 1, wherein at least one of the steps of partitioning, instantiating, storing, and executing are performed on a server or in a data center to generate an image, and the image is streamed to a user device.

18. The computer-implemented method of claim 1, wherein at least one of the steps of partitioning, instantiating, storing, and executing are performed within a cloud computing environment.

19. The computer-implemented method of claim 1, wherein at least one of the steps of partitioning, instantiating, storing, and executing are performed for training, testing, or inferencing with a neural network employed in a machine, robot, or autonomous vehicle.

20. The computer-implemented method of claim 1, wherein at least one of the steps of partitioning, instantiating, storing, and executing is performed on a virtual machine comprising a portion of a graphics processing unit.

21. A non-transitory computer-readable media storing computer instructions that, when executed by a stacked memory system, cause the one or more processors to perform the steps of:
partitioning an N-dimensional array processed by an operation specified by the application program into a first number of N-dimensional sub-arrays;
instantiating portions of the application program that include the operation to produce a second number of program tiles, wherein each program tile comprises instructions for a sub-loop of the operation;
storing a portion of data associated with each sub-array in a local memory block comprising a memory tile of memory tiles, wherein the memory tiles are fabricated within a memory die that is stacked with a processor die within which a two-dimensional (2D) array of processing tiles are fabricated and conductive paths couple each processing tile in the 2D array to a corresponding one of the memory tiles for communication between each processing tile and the corresponding memory tile; and executing the second number of the program tiles by the processing tiles to compute results for the operation, wherein a tile communication network for transmitting memory access requests from each processing tile to memory tiles coupled to a different processing tile is fabricated in the processor die connects each processing tile in the 2D array with adjacent processing tiles in a first dimension of the 2D array and with adjacent processing tiles in a second dimension of the 2D array.

22. The non-transitory computer-readable media of claim 21, further comprising:

determining that data is not stored in a first memory tile of the memory tiles that is coupled to a first processing tile of the processing tiles and is stored in a second memory tile coupled to a second processing tile of the processing tiles; and migrating a thread including at least one of the instructions executing on the first processing tile to the second processing tile for processing of the data stored in the second memory tile.

23. The computer-readable media of claim 21, wherein at least one additional memory die is stacked on the memory die and the local memory block for each processing tile comprises the memory tile and additional memory tiles fabricated within the additional memory die that are coupled to the processing tile by the conductive paths.

24. A computer-implemented method of executing an application program by a computer system which includes a stacked memory system, the stacked memory system having a processor die stacked with one or more memory dice, the application program including an operation which uses an N-dimensional array of memory, the method comprising:

partitioning the N-dimensional array processed by the operation into a first number of N-dimensional sub-arrays;

instantiating portions of the application program that include the operation, to produce a second number of program tiles, wherein each program tile comprises instructions for a sub-loop of the operation;

distributing data for processing each sub-array to memory tiles, wherein the memory tiles are fabricated within each of the one or more memory dice and conductive paths couple each memory tile to a corresponding processing tile of a two-dimensional (2D) array of processing tiles that are fabricated within the processor die, wherein additional conductive paths are not fabricated within each memory die of the memory dice for communication between the memory tiles within the memory die; and executing the second number of the program tiles by the processing tiles to compute results for the operation, wherein a tile communication network for transmitting memory access requests that is fabricated in the processor die connects each processing tile in the 2D array with adjacent processing tiles in a first dimension of the 2D array and with adjacent processing tiles in a second dimension of the 2D array.

25. The computer-implemented method of claim 24, wherein N is at least two and the second number does not equal the first number.

* * * * *